United States Patent
Kim et al.

(10) Patent No.: US 12,402,307 B2
(45) Date of Patent: Aug. 26, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Seungyoon Kim, Seoul (KR); Jaeryong Sim, Suwon-si (KR); Jeehoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 678 days.

(21) Appl. No.: 17/692,797

(22) Filed: Mar. 11, 2022

(65) Prior Publication Data

US 2022/0406801 A1    Dec. 22, 2022

(30) Foreign Application Priority Data

Jun. 21, 2021 (KR) .................. 10-2021-0079835

(51) Int. Cl.
*H10B 41/35* (2023.01)
*H01L 23/522* (2006.01)
(Continued)

(52) U.S. Cl.
CPC ......... *H10B 41/35* (2023.02); *H01L 23/5226* (2013.01); *H01L 23/5283* (2013.01);
(Continued)

(58) Field of Classification Search
CPC ... H01L 25/105; H01L 25/18; H01L 25/0657; H01L 2224/08145; H10B 41/35;
(Continued)

(56) References Cited

U.S. PATENT DOCUMENTS 8,697,339 B2   4/2014   Zhuang et al.
9,012,287 B2   4/2015   Liaw
(Continued)

FOREIGN PATENT DOCUMENTS

KR   20200037108 A   4/2020
KR   20210032894 A   3/2021

OTHER PUBLICATIONS

Korean Intellectual Property Office Request for the Submission of an Opinion in related Korean Patent Application No. 1020210079835; mailed Apr. 9, 2025 (9 pages).

*Primary Examiner* — Moazzam Hossain
(74) *Attorney, Agent, or Firm* — Wolf, Greenfield & Sacks, P.C.

(57) ABSTRACT

A semiconductor device and a data storage system, the device including a lower structure; and an upper structure on the lower structure and including a memory cell array, wherein the lower structure includes a semiconductor substrate, first and second active regions spaced apart from each other in a first direction on the semiconductor substrate, the first and second active regions being defined by an isolation insulating layer on the semiconductor substrate, and first and second gate pattern structures extending in the first direction to cross the first and second active regions, respectively, on the semiconductor substrate, the first gate pattern structure and the second gate pattern structure have first and second end portions spaced apart from each other in a facing manner in the first direction, respectively, and the first and second end portions are concavely curved in opposite directions away from each other in a plan view.

19 Claims, 22 Drawing Sheets

(51) Int. Cl.
*H01L 23/528* (2006.01)
*H10B 41/10* (2023.01)
*H10B 41/27* (2023.01)
*H10B 43/10* (2023.01)
*H10B 43/27* (2023.01)
*H10B 43/35* (2023.01)

(52) U.S. Cl.
CPC ............. *H10B 41/10* (2023.02); *H10B 41/27* (2023.02); *H10B 43/10* (2023.02); *H10B 43/27* (2023.02); *H10B 43/35* (2023.02)

(58) Field of Classification Search
CPC ........ H10B 41/10; H10B 41/27; H10B 41/20; H10B 41/30; H10B 41/40; H10B 41/50; H10B 43/10; H10B 43/27; H10B 43/35; H10B 43/40; H10B 43/50; H10B 43/20; H10B 43/30
See application file for complete search history.

(56) References Cited

U.S. PATENT DOCUMENTS

| | | |
|---|---|---|
| 10,157,746 B2 | 12/2018 | Hsieh |
| 10,431,308 B1 | 10/2019 | Wang |
| 10,763,863 B2 | 9/2020 | Liaw |
| 10,790,372 B2 | 9/2020 | Greene et al. |
| 2008/0296695 A1* | 12/2008 | Yang ..................... H10D 84/85 257/E21.409 |
| 2015/0003151 A1 | 1/2015 | Lee |
| 2019/0252308 A1 | 8/2019 | Liu et al. |
| 2019/0333914 A1* | 10/2019 | Min ................... H01L 21/76232 |
| 2020/0104462 A1 | 4/2020 | Chen et al. |
| 2022/0367655 A1* | 11/2022 | Chu ................... H10D 30/0212 |
| 2022/0399355 A1* | 12/2022 | Tsuda ..................... H10B 12/01 |

* cited by examiner

SEMICONDUCTOR DEVICE AND DATA STORAGE SYSTEM INCLUDING THE SAME

CROSS-REFERENCE TO RELATED APPLICATION

This application claims benefit of priority to Korean Patent Application No. 10-2021-0079835 filed on Jun. 21, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

A semiconductor device may be capable of storing high-capacity data in a data storage system requiring data storage. A method for increasing data storage capacity of semiconductor devices has been considered.

SUMMARY

The embodiments may be realized by providing a semiconductor device including a lower structure; and an upper structure on the lower structure and including a memory cell array, wherein the lower structure includes a semiconductor substrate, a first active region and a second active region spaced apart from each other in a first direction on the semiconductor substrate, the first active region and second active region being defined by an isolation insulating layer on the semiconductor substrate, and a first gate pattern structure and a second gate pattern structure extending in the first direction to cross the first active region and the second active region, respectively, on the semiconductor substrate, the first gate pattern structure and the second gate pattern structure have a first end portion and a second end portion spaced apart from each other in a facing manner in the first direction, respectively, and the first end portion and the second end portion are concavely curved in opposite directions away from each other in a plan view.

The embodiments may be realized by providing a semiconductor device including a lower structure; and an upper structure on the lower structure, wherein the lower structure includes a semiconductor substrate, a first active region and a second active region spaced apart from each other in a first direction on the semiconductor substrate, the first active region and second active region being defined by an isolation insulating layer on the semiconductor substrate, and a first gate pattern structure and a second gate pattern structure extending in the first direction to cross the first active region and the second active region, respectively, on the semiconductor substrate, the first gate pattern structure has a first side surface extending in the first direction and a first end portion facing the second gate pattern structure, the second gate pattern structure has a second side surface extending in the first direction and a second end portion facing the first end portion of the first gate pattern structure, and a minimum distance in the first direction between the first side surface of the first gate pattern structure and the second side surface of the second gate pattern structure is less than a distance in the first direction between a central portion of the first end portion of the first gate pattern structure and a central portion of the second end portion of the second gate pattern structure in a plan view.

The embodiments may be realized by providing a data storage system including a semiconductor storage device including a lower structure including a semiconductor substrate, circuit elements on the semiconductor substrate, and a lower interconnection structure electrically connected to the circuit elements, an upper structure on the lower structure, and an input/output (I/O) pad electrically connected to the circuit elements; and a controller electrically connected to the semiconductor storage device through the I/O pad and controlling the semiconductor storage device, wherein the circuit elements of the lower structure include a first active region and a second active region spaced apart from each other in a first direction on the semiconductor substrate, the first active region and second active region being defined by an isolation insulating layer on the semiconductor substrate, and a first gate pattern structure and a second gate pattern structure respectively crossing the first active region and the second active region to extend in the first direction on the semiconductor substrate, the upper structure includes an upper substrate on the lower structure, a stack structure including interlayer insulating layers and gate electrodes alternately stacked in a vertical direction, perpendicular to an upper surface of the upper substrate, on the upper substrate, and a channel structure penetrating through the stack structure in the vertical direction and including a channel layer, the first gate pattern structure and the second gate pattern structure include a first end portion and a second end portion spaced apart from each other in a facing manner in the first direction, respectively, and the first end portion and the second end portion are concavely curved in opposite directions away from each other in a plan view.

BRIEF DESCRIPTION OF DRAWINGS

Features will be apparent to those of skill in the art by describing in detail exemplary embodiments with reference to the attached drawings in which.

DETAILED DESCRIPTION

Figure 1:
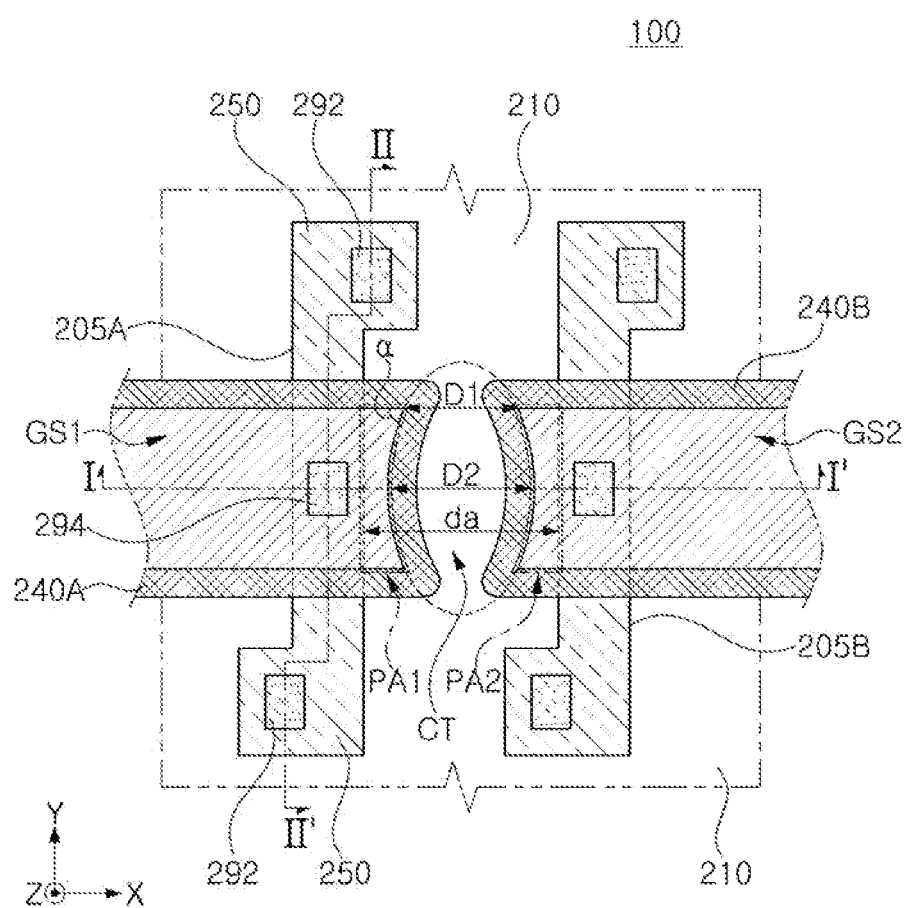
FIG. 1 is a schematic plan view of a semiconductor device according to example embodiments.

FIG. 1 is a schematic plan view of a semiconductor device according to example embodiments. In FIG. 1, only a layout of main components of the semiconductor device is illustrated.

Figure 2A:
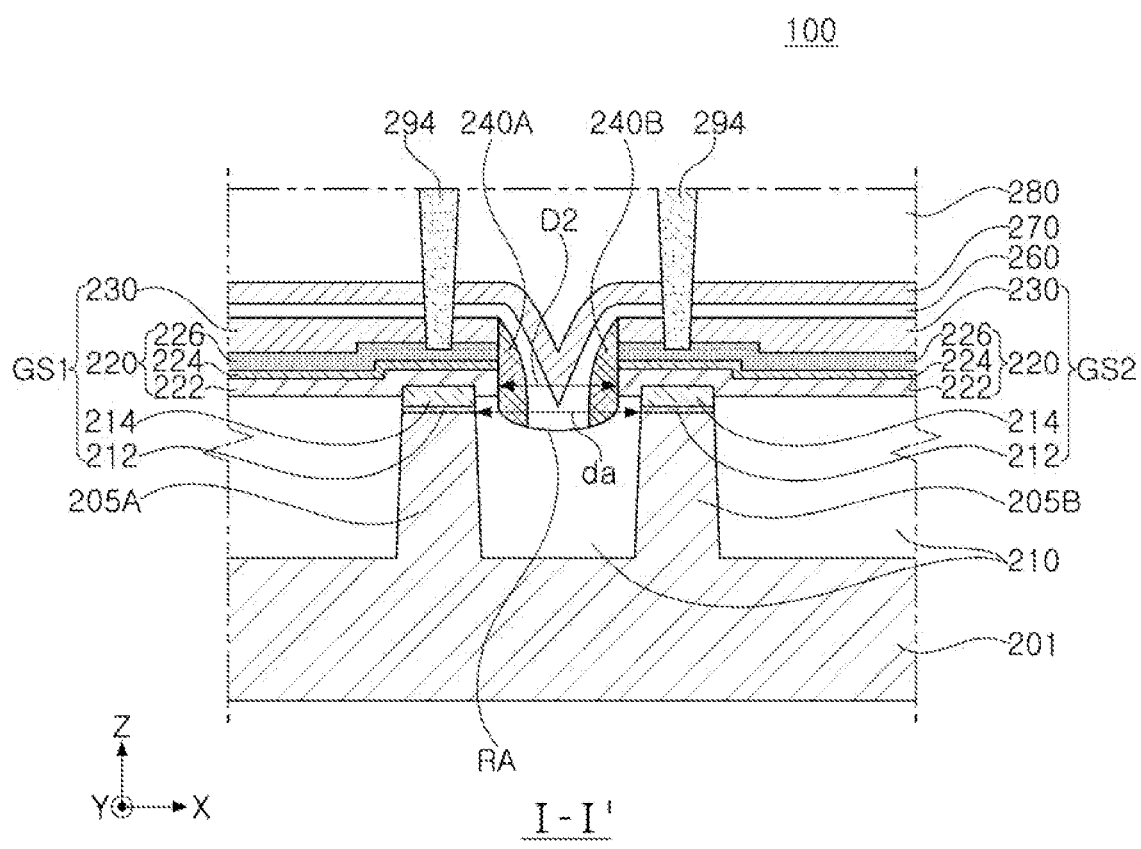
FIG. 2A is a schematic cross-sectional view of a semiconductor device according to example embodiments.

FIG. 2A is a schematic cross-sectional view of a semiconductor device according to example embodiments. FIG. 2A is a cross-sectional view of the semiconductor device of FIG. 1, taken along line I-I'.

Figure 2B:
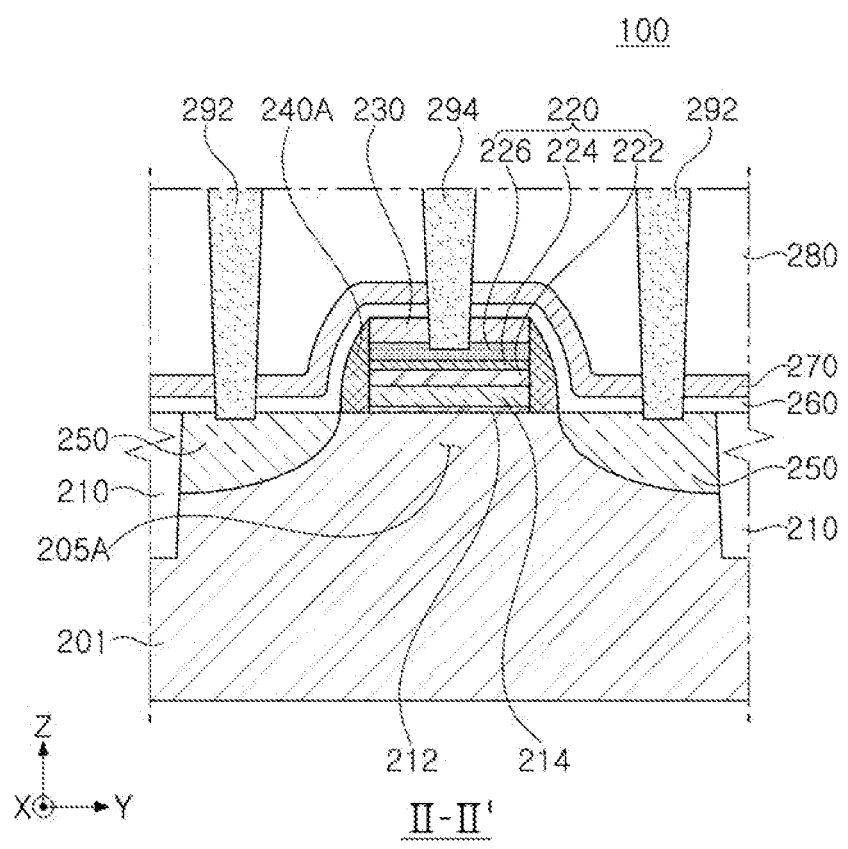
FIG. 2B is a schematic cross-sectional view of a semiconductor device according to example embodiments.

FIG. 2B is a schematic cross-sectional view of a semiconductor device according to example embodiments. FIG. 2B is a cross-sectional view of the semiconductor device of FIG. 1, taken along II-IP.

Referring to FIGS. 1 to 2B, a semiconductor device 100 may include a semiconductor substrate 201, active regions 205A and 205B on the semiconductor substrate 201, an isolation insulating layer 210 defining the active regions 205A and 205B, gate pattern structures GS1 and GS2 extending to cross the active regions 205A and 205B, and source/drain regions 250 in the active regions 205A and 205B on at least one side of the gate pattern structures GS1 and GS2. The semiconductor device 100 may further include spacer layers 240A and 240B covering side surfaces of the gate pattern structures GS1 and GS2, respectively, a buffer insulating layer 260 on the gate pattern structures GS1 and GS2, an etch stop layer 270, an insulating layer 280 on the etch stop layer 270, and contact plugs 292 and 294. Each of the gate pattern structures GS1 and GS2 may include a gate dielectric layer 212, a lower gate pattern 214, an upper gate pattern 220, and a mask pattern layer 230. The upper gate pattern 220 may include a first pattern layer 222, a second pattern layer 224, and a third pattern layer 226 being sequentially stacked. As used herein, the terms "first," "second," and the like are merely for identification and differentiation, and are not intended to imply or require sequential inclusion (e.g., a third element and a fourth element may be described without implying or requiring the presence of a first element or second element).

The semiconductor substrate 201 may include a semiconductor material, e.g., a group IV semiconductor, a group III-V compound semiconductor, or a group II-VI compound semiconductor. In an implementation, the group IV semiconductor may include silicon (Si), germanium (Ge), or silicon germanium (SiGe). The semiconductor substrate 201 may be provided as a bulk wafer, an epitaxial layer, a silicon on insulator (SOI) layer, a semiconductor on insulator (SeOI) layer, or the like. As used herein, the term "or" is not an exclusive term, e.g., "A or B" would include A, B, or A and B.

The active regions 205A and 205B may be defined by the isolation insulating layer 210 in the semiconductor substrate 201 and may be spaced apart from each other in a first direction, e.g., X-direction. The active regions 205A and 205B may include portions crossing the gate pattern structures GS1 and GS2 and extending in a second direction, e.g., Y-direction. Upper end portions of the active regions 205A and 205B may be positioned on a level lower than an upper surface of the isolation insulating layer 210. The source/drain regions 250 including impurities may be in portions of the active regions 205A and 205B. Accordingly, the active regions 205A and 205B may be understood as regions including regions in which the source/drain regions 250 are disposed.

At least one of the active regions 205A and 205B may include an extension portion extending (e.g., lengthwise) in the Y-direction, and contact portions on both sides of the extension portion in the Y-direction and connected to the extension portion, and the contact portion may be bent from the extension portion. In an implementation, the first active region 205A may include a first extension portion and a first contact portion and a second contact portion disposed on both sides of the first extension portion and bent from the first extension portion in opposite directions. The first contact portion and the second contact portion may be part of regions in which the source/drain regions 250 are disposed.

The isolation insulating layer 210 may define the active regions 205A and 205B in the semiconductor substrate 201. The isolation insulating layer 210 may be formed by, e.g., a shallow trench isolation (STI) process. The isolation insulating layer 210 may cover side surfaces of the active regions 205A and 205B facing each other in the X-direction. An upper surface of the isolation insulating layer 210 between the first active region 205A and the second active region 205B may have a region RA, which is concave in a direction toward a lower surface of the isolation insulating layer 210. The isolation insulating layer 210 may be formed of an insulating material. The isolation insulating layer 210 may include, e.g., silicon oxide, silicon nitride, or a combination thereof.

In an implementation, a distance da (e.g., maximum distance) between the first active region 205A and the second active region 205B in the first direction, e.g., X-direction, may be about 160 nm or less. The example embodiment may effectively improve or address issues or problems that could arise when a distance between end portions PA1 and PA2 of the gate pattern structures decreases as the patterns of the active regions 205A and 205B are miniaturized below the range mentioned above. The distance da may be greater than 0 nm and may be, e.g., greater than minimal pattern spacing achievable with photolithography equipment. It may also be understood that a width (e.g., maximum width) of the isolation insulating layer 210 between the first active region 205A and the second active region 205B in the X-direction is about 160 nm or less.

The gate pattern structures GS1 and GS2 may include a first gate pattern structure GS1 and a second gate pattern structure GS2 spaced apart from each other in the first direction, e.g., X-direction. The first gate pattern structure GS1 may cross the first active region 205A and extend in the X-direction, and the second gate pattern structure GS2 may cross the second active region 205B and extend in the X-direction. The first gate pattern structure GS1 may have the first end portion PA1 facing a gate isolation region CT, and the second gate pattern structure GS2 may have the second end portion PA2 facing the gate isolation region CT. The first end portion PA1 and the second end portion PA2 may face each other in the X-direction and may be spaced apart from each other. In an implementation, the first end portion PA1 may face the second gate pattern structure GS2, and the second end portion PA2 may face the first end portion PA1 of the first gate pattern structure GS1. The gate isolation region CT may indicate a region in which gate pattern structures on the same straight line in the X-direction are separated from each other.

In an implementation, in a plan view, the first end portion PA1 and the second end portion PA2 facing each other may be concavely curved in opposite directions away from each other (e.g., may have concavities that are open toward one another).

In an implementation, the first gate pattern structure GS1 may have a first side surface extending in the X-direction, and the second gate pattern structure GS2 may have a second side surface extending in the X-direction. In a plan view, a first distance D1 (in the X direction) between the first side surface of the first gate pattern structure GS1 and the second side surface of the second gate pattern structure GS2 may be less than a second distance D2 between a central portion of the first end portion PA1 of the first gate pattern structure GS1 and a central portion of the second end portion PA2 of the second gate pattern structure GS2. The first distance D1 may be a minimum distance between the first side surface of the first gate pattern structure GS1 and the second side surface of the second gate pattern structure GS2.

In an implementation, in a plan view, at an edge or a corner of the first end portion PA1, the first side surface and a cross-section of the first end portion PA1 of the first gate pattern structure GS1 may meet at an acute angle ($0°<\alpha<90°$). In a plan view, the side surfaces may also meet at an acute angle at another corner of the first end portion PA1 and both side corners of the second end portion PA2.

As the patterns of semiconductor devices shrink, the distance between the gate pattern structures may be reduced. Accordingly, the end portions of the gate pattern structures could be convexly rounded to reduce the area of a region in which the gate pattern structure and the active region intersect, thereby causing device failure. In addition, as the distance between the end portions of the adjacent gate pattern structures decreases, a patterning defect in which the gate pattern structures are not separated from each other could also occur, thereby causing device failure due to a short circuit between the gate pattern structures. According to an example embodiment, the gate isolation region CT may be in a rounded hole region to separate the gate pattern structures GS1 and GS2, and the end portions PA1 of the gate pattern structures GS1 and GS2 may be concavely rounded. Accordingly, device defects due to convex rounding of the end portions may be minimized, and a distance between the end portions may be secured to help reduce or prevent short circuits between the gate patterns.

A gate dielectric layer 212 may be on the active regions 205A and 205B. In an implementation, a side surface of the gate dielectric layer 212 may be substantially coplanar with a side surface of the first active region 205A. The gate dielectric layer 212 may be formed of silicon oxide.

The lower gate pattern 214 may be on the gate dielectric layer 212. A side surface of the lower gate pattern 214 may be substantially coplanar with a side surface of the gate dielectric layer 212. The lower gate pattern 214 may include a semiconductor layer including, e.g., polycrystalline silicon.

As used herein, the description of an element being substantially coplanar with another element refers to a case of being coplanar or of having a difference in the range of deviations occurring during a manufacturing process and may be interpreted as having the same meaning even without the expression "substantially."

The upper gate pattern 220 may be on the lower gate pattern 214. The upper gate pattern 220 may extend longer in the X-direction than the side surface of the lower gate pattern 214. At least a portion of the upper gate pattern 220, e.g., the first pattern layer 222 of the upper gate pattern 220, may cover a portion of the side surface of the lower gate pattern 214 and may extend onto an upper surface of the isolation insulating layer 210. The first pattern layer 222 of the upper gate pattern 220 may include a semiconductor layer including, e.g., polycrystalline silicon. The second pattern layer 224 of the upper gate pattern 220 may be a barrier layer, and the barrier layer may include a metal nitride or a metal silicon nitride. The metal nitride may include, e.g., titanium nitride (TiN), tantalum nitride (TaN), or tungsten nitride (WN), and the metal silicon nitride may include, e.g., titanium silicon nitride (TiSiN), tantalum silicon nitride (TaSiN), or tungsten silicon nitride (WSiN). In an implementation, the second pattern layer 224 may include graphene. The third pattern layer 226 of the upper gate pattern 220 may include a metal layer including, e.g., tungsten (W), copper (Cu), aluminum (Al), molybdenum (Mo), or rubidium (Rb).

The mask pattern layer 230 may be on the upper gate pattern 220. The mask pattern layer 230 may include, e.g., silicon nitride, silicon oxynitride, silicon carbonitride, or silicon oxide.

Herein, the components constituting the first gate pattern structure GS1 may be referred to as "the first gate dielectric layer 212, the first lower gate pattern 214, the first upper gate pattern 220, and the first mask pattern layer 230," respectively, and the components constituting the second gate pattern structure GS2 may be referred to as "the second gate dielectric layer 212, the second lower gate pattern 214, the second upper gate pattern 220, and the second mask pattern layer 230," respectively.

The spacer layers 240A and 240B may be on side surfaces of the gate pattern structures GS1 and GS2. The spacer layers 240A and 240B may include a first spacer layer 240A, surrounding side surfaces of the first gate pattern structure GS1 and a second spacer layer 240B surrounding side surfaces of the second gate pattern structure GS2. The first spacer layer 240A may cover the first side surface and the first end portion PA1 of the first gate pattern structure GS1. The second spacer layer 240B may cover the second side surface and the second end portion PA2 of the second gate pattern structure GS2 and may be spaced apart from the first spacer layer 240A. In the gate isolation region CT, the first spacer layer 240A and the second spacer layer 240B may cover the concave region RA of the upper surface of the isolation insulating layer 210. The spacer layers 240A and 240B may be formed along side profiles of the end portions PA1 and PA2 of the gate pattern structures GS1 and GS2. In an implementation, the spacer layers 240A and 240B may have a shape with one surface concavely curved toward the gate pattern structures GS1 and GS2 in a plan view. The spacer layers 240A and 240B may insulate the gate pattern structures GS1 and GS2 from the source/drain regions 250. The spacer layers 240A and 240B may be formed of silicon oxide, silicon nitride, or silicon oxynitride, and may include a plurality of layers.

The source/drain regions 250 may be in the active regions 205A and 205B on or at both sides of the gate pattern structures GS1 and GS2, respectively. The source/drain regions 250 may serve as a source region or a drain region of the transistor. The source/drain regions 250 may include P-type or N-type impurities. The source/drain regions 250 may include a plurality of regions including elements of different concentrations or doped elements.

The buffer insulating layer 260 may be on the gate pattern structures GS1 and GS2. The buffer insulating layer 260 may cover the first spacer layer 240A, the second spacer layer 240B, the source/drain regions 250, and the mask pattern layer 230. A portion of the buffer insulating layer 260 may extend downwardly along outer surfaces of the spacer layers 240A and 240B in the gate isolation region CT to cover the concave region RA of the upper surface of the isolation insulating layer 210. The buffer insulating layer 20 may be formed of an insulating material, e.g., silicon oxide, silicon nitride, or silicon oxynitride.

The etch stop layer 270 may be on the buffer insulating layer 260. The etch stop layer 270 may extend between the first gate pattern structure GS1 and the second gate pattern structure GS2 and may be sharp toward an upper surface of the isolation insulating layer 210 between the first active region 205A and the second active region 205B. The etch stop layer 270 may be formed of an insulating material, and may be formed of a material different from that of the insulating layer 280. The etch stop layer 270 may be formed of, e.g., silicon oxide, silicon nitride, or silicon oxynitride.

The insulating layer 280 may be on the etch stop layer 270. The insulating layer 280 may be formed of an insulating material. The insulating layer 280 may include a plurality of insulating layers.

The contact plugs 292 and 294 may penetrate through the insulating layer 280. First contact plugs 292, among the contact plugs 292 and 294, may be connected to the source/drain regions 250 through the etch stop layer 270 and the buffer insulating layer 260. The second contact plugs 294, among the contact plugs 292 and 294, may be connected to the upper gate pattern 220 through the etch stop layer 270, the buffer insulating layer 260, and the mask pattern layer 230. The contact plugs 292 and 294 may include a conductive material, e.g., tungsten (W), copper (Cu), aluminum (Al), or the like, and may further include a barrier layer formed of a metal nitride.

Figure 3:
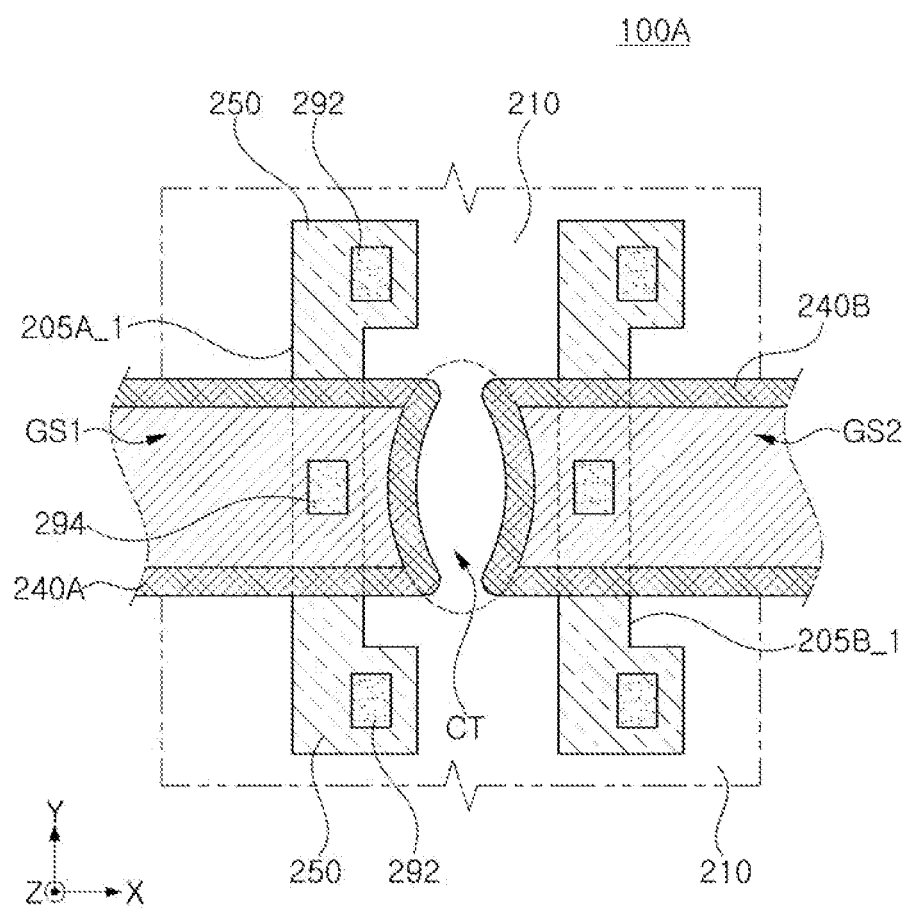
FIG. 3 is a schematic plan view of a semiconductor device according to example embodiments.
Figure 4:
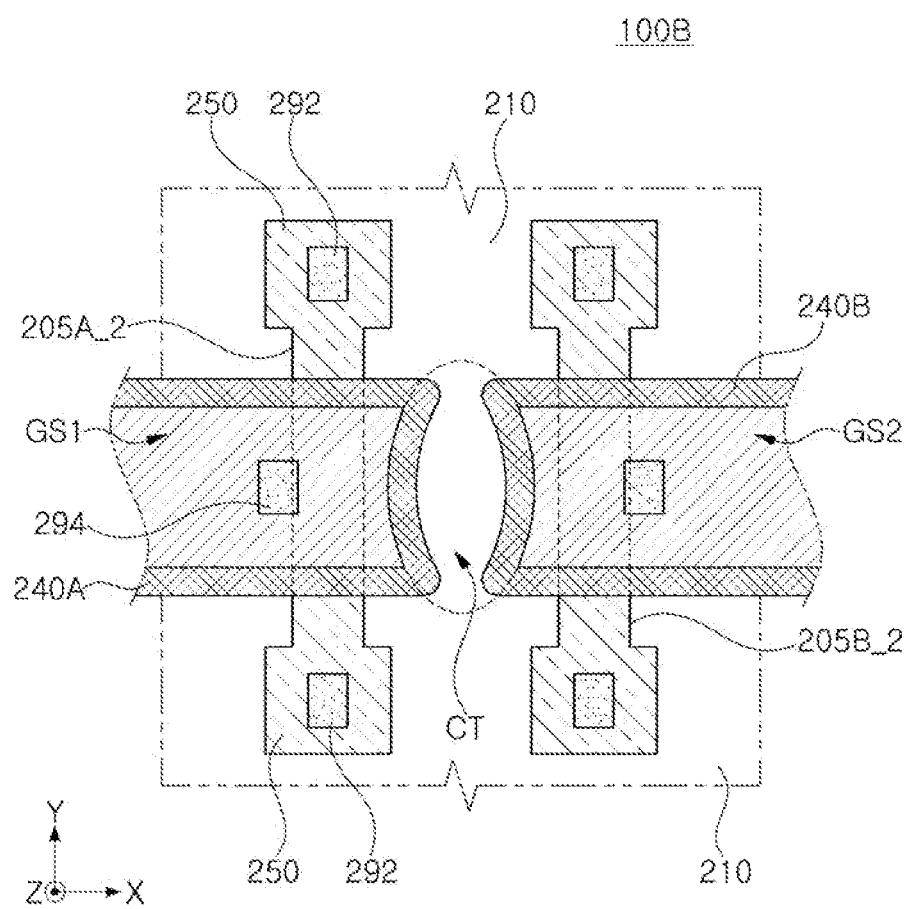
FIG. 4 is a schematic plan view of a semiconductor device according to example embodiments.
Figure 5:
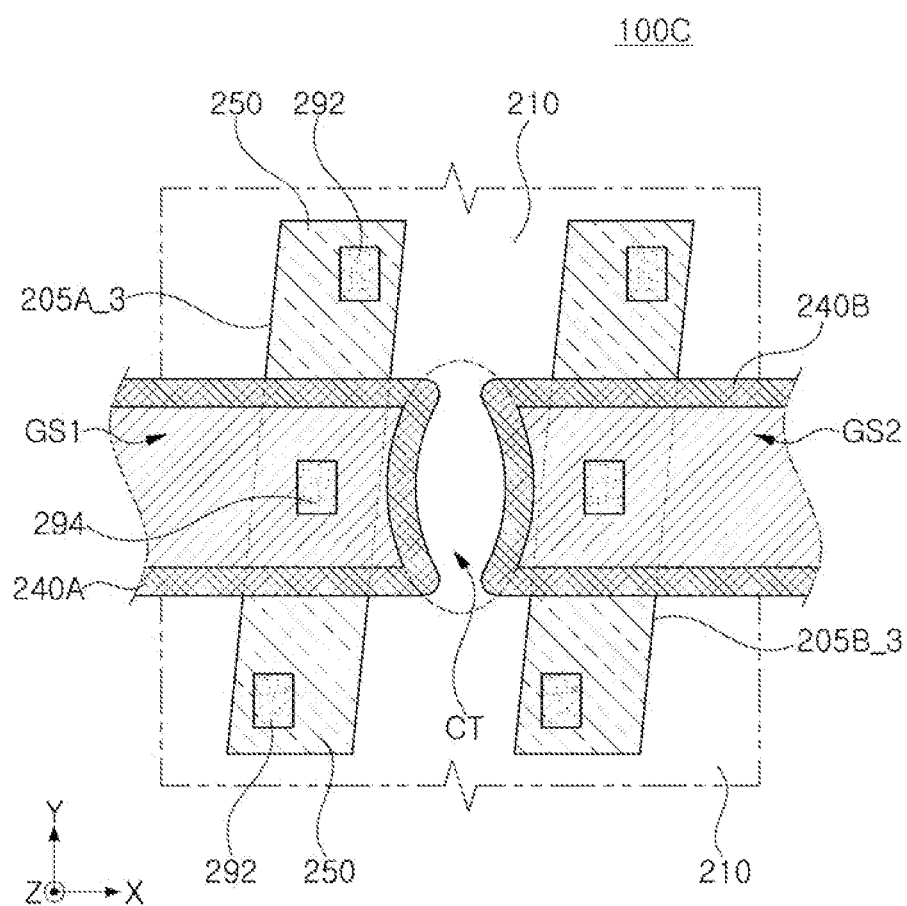
FIG. 5 is a schematic plan view of a semiconductor device according to example embodiments.

FIGS. 3 to 5 are schematic plan views of semiconductor devices according to example embodiments.

Referring to FIG. 3, shapes of active regions 205A_1 and 205B_1 of the semiconductor device 100A may vary. At least one of the active regions 205A_1 and 205B_1 may include an extension portion extending in the Y-direction and first and second contact portions on both sides of the extension portion in the Y-direction. The first contact portion and the second contact portion may be bent from the extension portion in the same direction, e.g., in the X-direction.

Referring to FIG. 4, shapes of active regions 205A_2 and 205B_2 of the semiconductor device 100B may vary. At least one of the active regions 205A_2 and 205B_2 may have an 'I' shape or a shape similar thereto.

Referring to FIG. 5, at least one of active regions 205A_3 and 205B_3 of a semiconductor device 100C may extend in a direction oblique to the X-direction. In an implementation, the first active region 205A_3 may extend in a direction oblique (e.g., inclined) to the X and Y-directions and may have a parallelogram shape or a shape similar thereto in a plan view.

Figure 6:
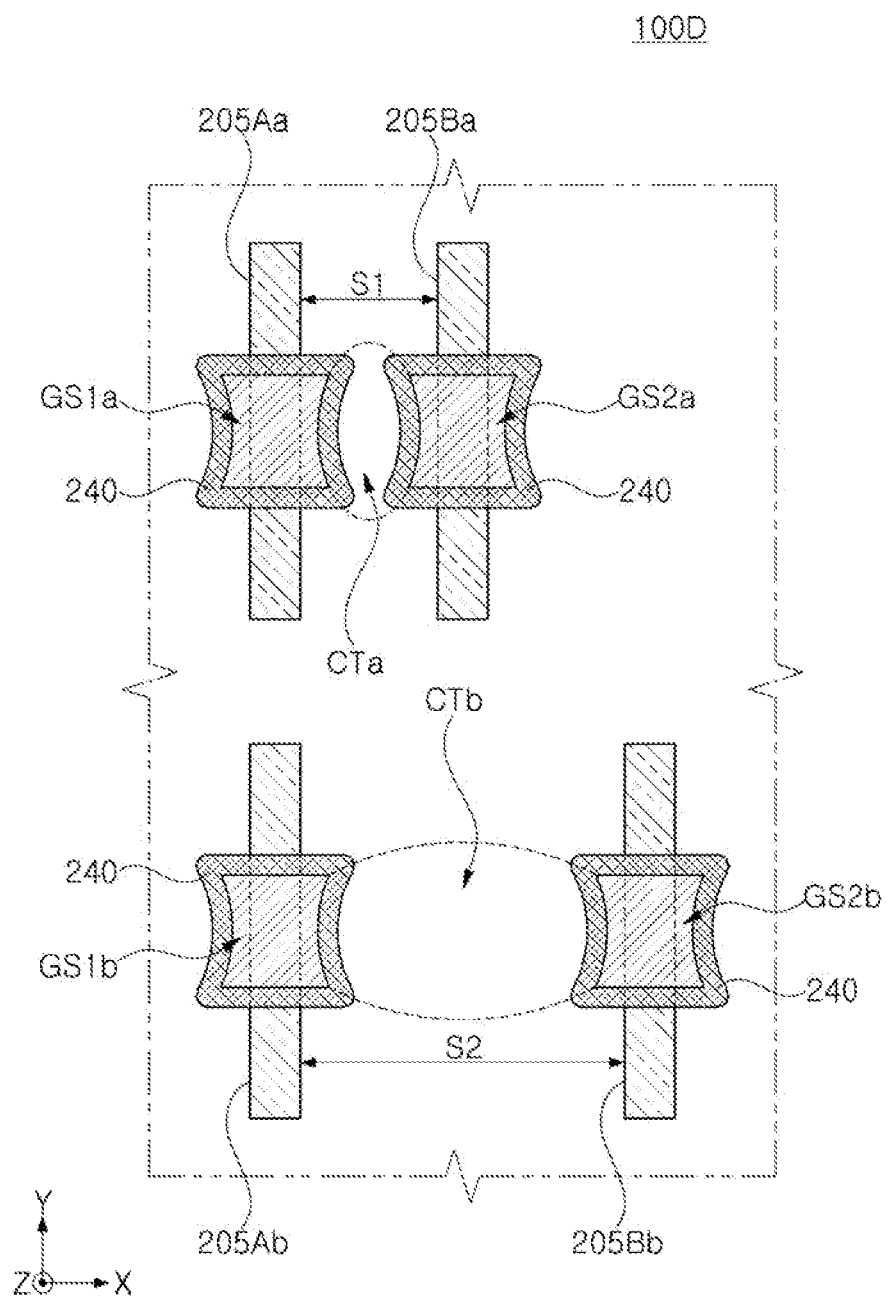
FIG. 6 is a schematic plan view of a semiconductor device according to example embodiments.

FIG. 6 is a schematic plan view of a semiconductor device according to example embodiments.

Referring to FIG. 6, in a semiconductor device 100D, the gate isolation regions CTa and CTb separating the gate pattern structures in the X-direction may be formed in an irregular arrangement or shape. In an implementation, first and second active regions 205Aa and 205Ba may be spaced apart from each other by a first interval S1 in the X-direction, and third and fourth active regions 205Ab and 205Bb may be spaced apart from each other by a second interval S2 (greater than the first interval S1). Even if the intervals between the active regions are different, the gate isolation regions CTa and CTb may be formed in a non-continuous rounded hole type, so that the gate pattern structures may be less affected by the arrangement of the patterns in the same straight line than a case in which the gate isolation region is formed in a line shape, and thus, the gate pattern structures may be more stably separated.

Figure 7:
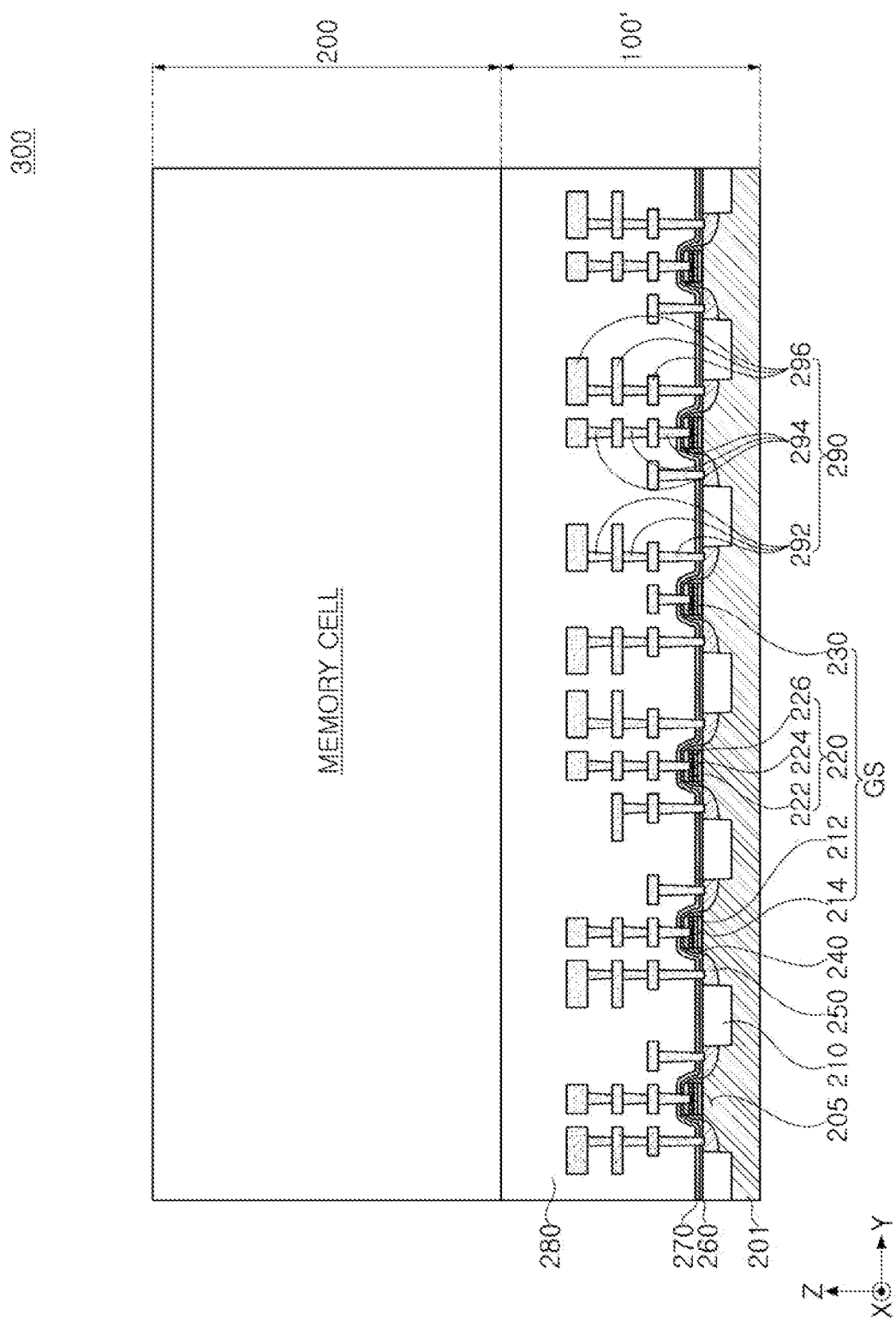
FIG. 7 is a schematic cross-sectional view of a semiconductor device according to example embodiments.

FIG. 7 is a schematic cross-sectional view of a semiconductor device according to example embodiments.

Referring to FIG. 7, a semiconductor device 300 may include a lower structure 100' and an upper structure 200 on the lower structure 100'. The lower structure 100' may correspond to the structure including the semiconductor substrate 201, the active regions 205, the gate pattern structure GS, and the source/drain regions 250 of the semiconductor device of FIGS. 1 to 6 described above. The lower structure 100' may include a lower interconnection structure 290 including contact plugs 292 and 294 and lower interconnections 296. A memory cell region CELL may be in the upper structure 200, and the memory cell region CELL may include nonvolatile memory devices such as DRAM, static RAM (SRAM), or the like, and volatile memory devices such as PRAM, MRAM, ReRAM, or flash memory device. In an implementation, the lower structure 100' and the upper structure 200 may be arranged side by side in a horizontal direction.

Figure 8A:
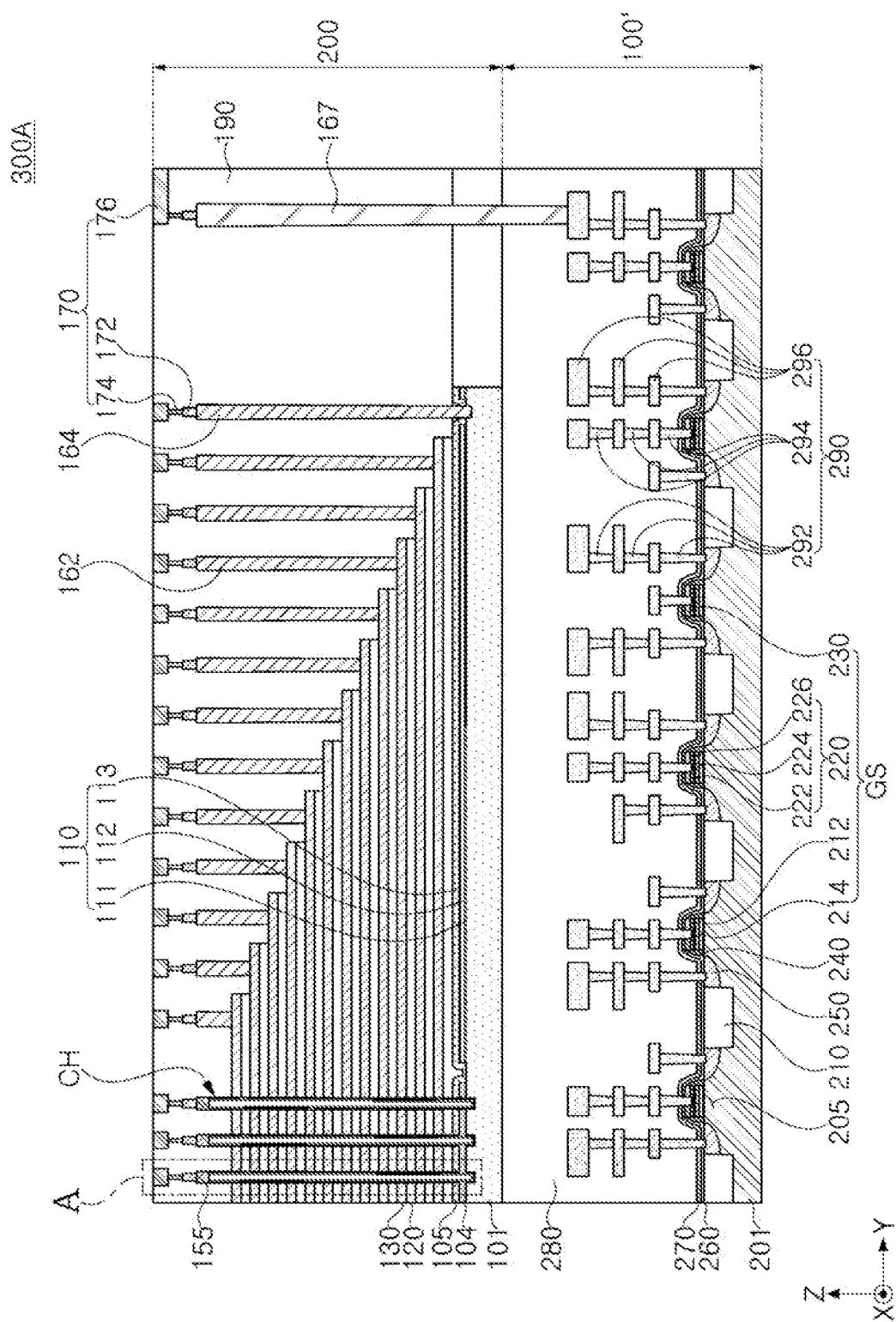
FIG. 8A is a schematic cross-sectional view of a semiconductor device according to example embodiments.

FIG. 8A is a schematic cross-sectional view of a semiconductor device according to example embodiments.

Figure 8B:
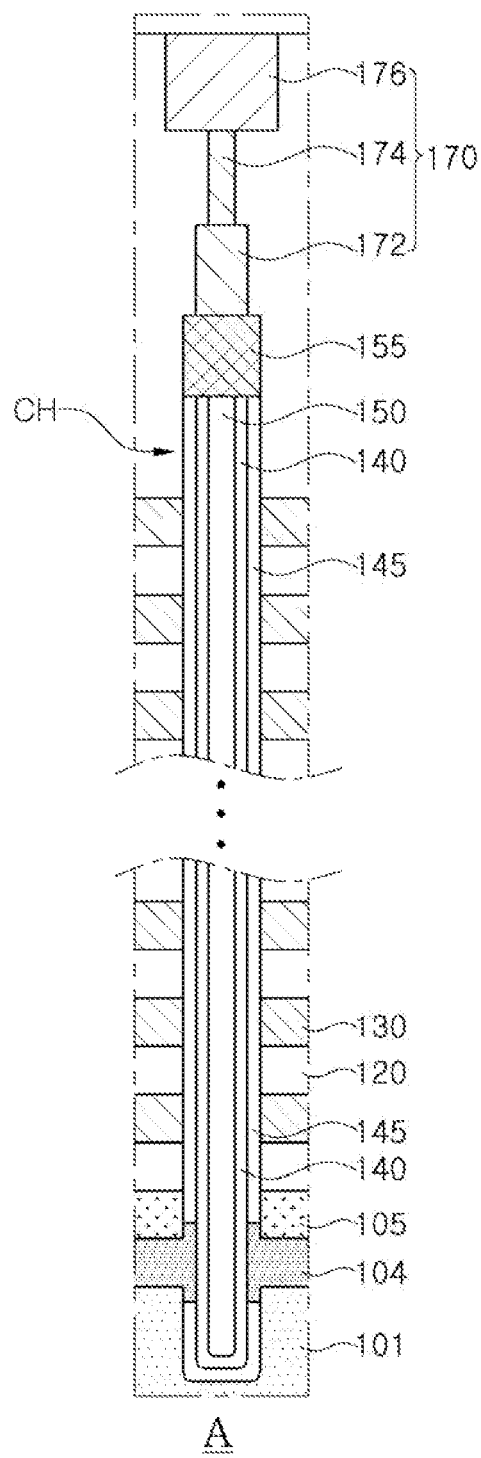
FIG. 8B is a schematic partially enlarged cross-sectional view of a semiconductor device according to example embodiments.

FIG. 8B is a schematic partially enlarged cross-sectional view of a semiconductor device according to example embodiments. FIG. 8B is an enlarged view of region 'A' of FIG. 8A.

Referring to FIGS. 8A and 8B, a semiconductor device 300A may include a lower structure 100' and an upper structure 200, and a memory cell region of the upper structure 200 may include a flash memory device including gate electrodes 130 and a channel structure CH. The lower structure 100' may correspond to a structure including circuit elements including the semiconductor substrate 201, the active regions 205, the gate pattern structure GS, and the source/drain regions 250 of the semiconductor device of FIGS. 1 to 6 described above.

The upper structure 200 may include an upper substrate 101, interlayer insulating layers 120 and gate electrodes 130 alternately stacked on the upper substrate 101 in the Z-direction, a channel structure CH penetrating through the gate electrodes 130 in the Z-direction and including a channel layer 140, and an upper interconnection structure 170. The upper structure 200 may further include first and second horizontal conductive layers 104 and 105 between the upper substrate 101 and a stack structure of the gate electrodes 130, a horizontal insulating layer 110, an upper insulating layer 190, gate contact plugs 162, a source contact plug 164, and a peripheral contact plug 167.

The upper substrate 101 may include a semiconductor material, e.g., a group IV semiconductor, a group III-V compound semiconductor, or a group II-VI compound semiconductor. The upper substrate 101 may include, e.g., a polycrystalline silicon layer having N-type or P-type conductivity. The upper substrate 101 may be electrically connected to the upper interconnection structure 170 through the source contact plug 164.

The gate electrodes 130 may be stacked on the upper substrate 101 and spaced apart from each other in the Z-direction. The gate electrodes 130 may extend in the Y-direction. The gate electrodes 130 may include a lower gate electrode forming a gate of a ground select transistor, memory gate electrodes forming a plurality of memory cells, and upper gate electrodes forming the gates of string select transistors. The number of memory gate electrodes constituting the memory cells may be determined according to capacity of the semiconductor device 300A. In an implementation, each of the gate electrodes 130 constituting the string select transistor and the ground select transistor may be one or two or more.

The gate electrodes 130 may be vertically spaced apart and stacked on the upper substrate 101, and may extend to have different lengths in the X-direction to form a step structure in the form of a step. Due to the step structure, the gate electrodes 130 may have pad regions in which the lower gate electrode 130 extends longer than the upper gate electrode 130 so as to be exposed upwardly, and gate contact plugs 162 may be disposed in the pad regions and connected to the gate electrodes 130. The gate contact plugs 162 may be electrically connected to the lower interconnection structure 290 of the lower structure 100' through through-contact plugs penetrating through a separate through-region.

The gate electrodes 130 may each include a first layer and a second layer. The first layer may cover upper and lower surfaces of the second layer and may extend between the channel structures CH and the second layer. The first layer may include a high dielectric material such as aluminum oxide (AlO), and the second layer may include titanium (Ti), titanium nitride (TiN), tantalum (Ta), tantalum nitride (TaN), tungsten (W), or tungsten nitride (WN). In an implementation, the gate electrodes 130 may include polycrystalline silicon or a metal-semiconductor compound.

The interlayer insulating layers 120 may be between the gate electrodes 130. Like the gate electrodes 130, the interlayer insulating layers 120 may be spaced apart from each other in the Z-direction and may be disposed to extend in the Y-direction. The interlayer insulating layers 120 may include an insulating material such as silicon oxide. Some of the interlayer insulating layers 120 may have different thicknesses.

The first horizontal conductive layer 104 may function a portion of a common source line of the semiconductor device 300A, e.g., as a common source line together with the upper substrate 101. The first horizontal conductive layer 104 may not extend to a region in which the gate electrodes 130 form a step structure. The first horizontal conductive layer 104 and the second horizontal conductive layer 105 may include a conductive material, e.g., doped polycrystalline silicon. In this case, at least the first horizontal conductive layer 104 may be a layer doped with impurities of the same conductivity type as that of the upper substrate 101, and the second horizontal conductive layer 105 may be a doped layer or a layer including impurities spread from the first horizontal conductive layer 104. In an implementation, a material of the second horizontal conductive layer 105 may be replaced with an insulating layer.

The horizontal insulating layer 110 may include first to third horizontal insulating layers 111, 112, and 113 stacked on the upper substrate 101. The horizontal insulating layers 111, 112, and 113 may be partially replaced with the first horizontal conductive layer 104 of FIG. 8A through a subsequent process. The first and third horizontal insulating layers 111 and 113 may be formed of the same material, and the second horizontal insulating layer 112 may be formed of a material different from that of the first and third horizontal insulating layers 111 and 113. The second horizontal conductive layer 105 may be bent, while covering side surfaces of the horizontal insulating layers 111, 112, and 113 in a region in which the horizontal insulating layers 111, 112, and 113 are patterned, so as to be in contact with the upper substrate 101.

The channel structures CH may each form one memory cell string, and may be spaced apart from each other, while forming rows and columns. The channel structures CH may form a grid pattern or may be disposed in a zigzag form in one direction. The channel structures CH may penetrate through the stack structure of the gate electrodes 130 in the Z-direction. The channel structures CH may have a columnar shape and may have inclined side surfaces narrower in width in a direction toward the upper substrate 101 according to an aspect ratio.

The channel layer 140 may be in the channel structures CH. In the channel structures CH, the channel layer 140 may have an annular shape surrounding an internal core insulating layer 150. The channel layer 140 may be in contact with the first horizontal conductive layer 104 from a lower portion thereof and may be electrically connected to the upper substrate 101. The channel layer 140 may include a semiconductor material such as polycrystalline silicon or single crystal silicon.

A channel pad 155 may be on the channel layer 140 in the channel structures CH. The channel pad 155 may cover an upper surface of the core insulating layer 147 and be electrically connected to the channel layer 140. The channel pad 155 may include, e.g., doped polycrystalline silicon. The channel pad 155 may include a semiconductor material such as polycrystalline silicon or single crystal silicon and may include, e.g., doped polycrystalline silicon.

A gate dielectric layer 145 may be between the gate electrodes 130 and the channel layer 140. The gate dielectric layer 145 may include a tunneling layer, an information storage layer, and a blocking layer sequentially stacked from the channel layer 140. The tunneling layer may tunnel charges into the information storage layer and may include, e.g., silicon oxide ($SiO_2$), silicon nitride ($Si_3N_4$), silicon oxynitride (SiON), or a combination thereof. The information storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In an implementation, at least a portion of the gate dielectric layer 145 may extend along the gate electrodes 130 in a horizontal direction.

As shown in FIG. 8B, the channel structures CH may penetrate through the gate electrodes 130 in the Z-direction and penetrate through the first horizontal conductive layer 104 and the second horizontal conductive layer 105 in the Z-direction so as to extend into the upper substrate 101. The first horizontal conductive layer 104 may be in contact with the channel layer 140 through the gate dielectric layer 145. The first horizontal conductive layer 104 may be directly connected to the channel layer 140 around the channel layer 140.

The gate contact plugs 162 may be connected to the gate electrodes 130, the source contact plug 164 may be connected to the upper substrate 101, and the peripheral contact plug 167 may be connected to the lower interconnection structure 290. The gate contact plugs 162, the source contact plug 164, and the peripheral contact plug 167 may include a conductive pattern and a barrier layer covering side surfaces and bottom surface of the conductive pattern. The barrier layer may include, e.g., titanium (Ti), titanium nitride (TiN), tantalum (Ta), or tantalum nitride (TaN). The conductive pattern may include a metal material, e.g., tungsten (W), titanium (Ti), copper (Cu), cobalt (Co), aluminum (Al), or alloys thereof.

The upper interconnection structure 170 may include first contacts 172, second contacts 174, and upper interconnections 176. The upper interconnection structure 170 may be electrically connected to the gate electrodes 130 and the channel structures CH. The first contacts 172 may be on the channel pads 155 and the gate contact plugs 162, and the second contacts 174 may be on the first contacts 172. The upper interconnection structure 170 may include a conductive pattern and a barrier layer covering side surfaces and a bottom surface of the conductive pattern. The barrier layer may include, e.g., titanium (Ti), titanium nitride (TiN), tantalum (Ta), or tantalum nitride (TaN). The conductive pattern may include a metal material, e.g., tungsten (W), titanium (Ti), copper (Cu), cobalt (Co), aluminum (Al), or alloys thereof. The number of layers and arrangement of contacts and upper interconnections constituting the upper interconnection structure 170 may be variously changed.

Figure 9:
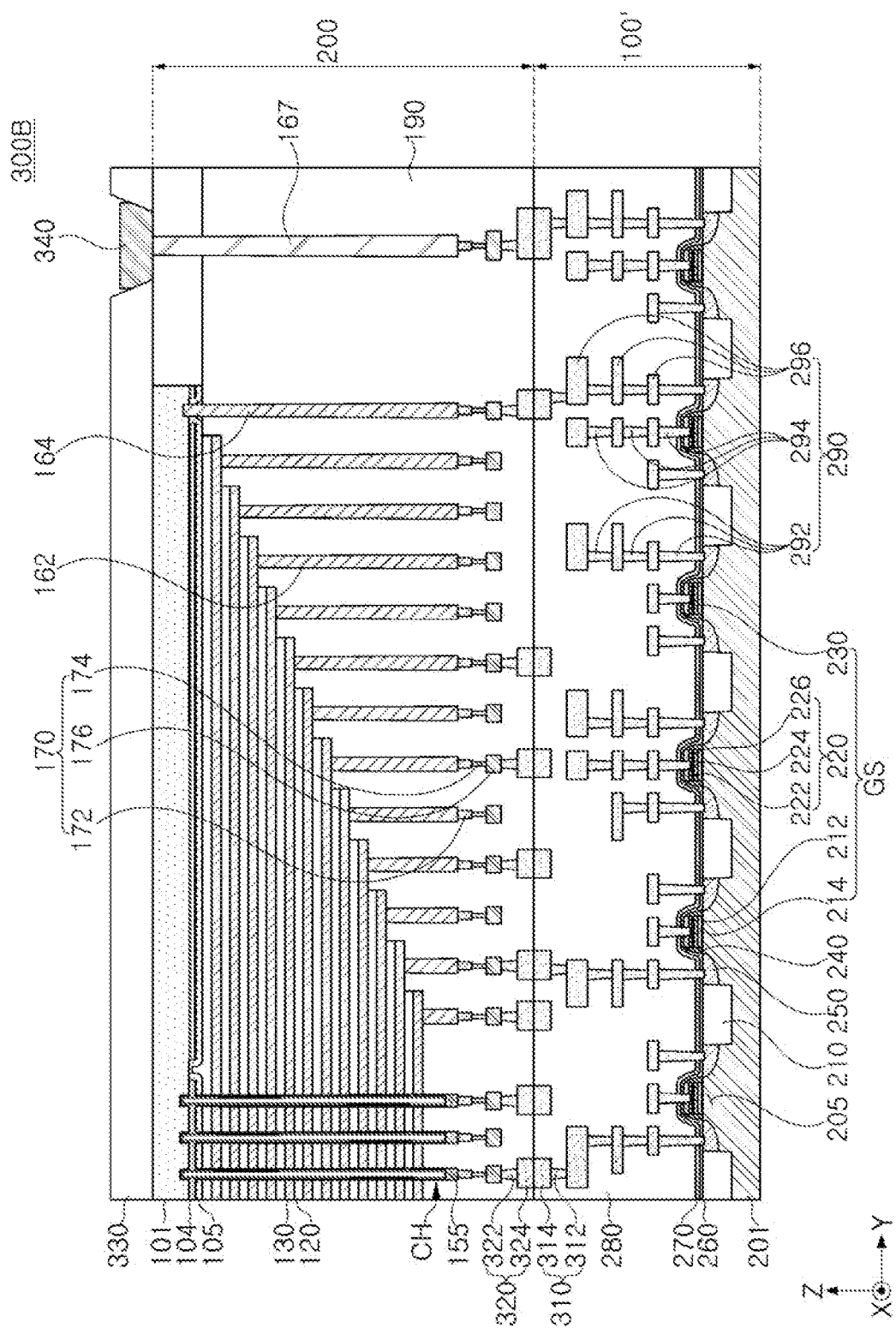
FIG. 9 is a schematic cross-sectional view of a semiconductor device according to example embodiments.

FIG. 9 is a schematic cross-sectional view of a semiconductor device according to example embodiments.

Referring to FIG. 9, a lower structure 100' and an upper structure 200 of a semiconductor device 300B may be bonded to each other through a bonding structure. The upper structure 200 of the semiconductor device 300B is shown by inverting the upper structure 200 of the semiconductor device 300A of FIG. 8A, the lower structure 100' may further include a lower bonding structure 310, and the upper structure 200 may further include an upper bonding structure 320. The peripheral contact plug 167 may be connected to a pad layer 340 formed in an opening of an outer insulating layer 330 disposed on the upper substrate 101.

The lower bonding structure 310 may include a lower bonding via 312 and a lower bonding pad 314 electrically connected to the lower interconnection structure 290. The upper bonding structure 320 may include an upper bonding via 322 and an upper bonding pad 324 electrically connected to the upper interconnection structure 170. The lower bonding structure 310 and the upper bonding structure 320 may each include, e.g., tungsten (W), aluminum (Al), copper (Cu), tungsten nitride (WN), tantalum nitride (TaN), and titanium nitride (TiN), or a combination thereof. The lower bonding pad 314 and the upper bonding pad 324 may function as bonding layers for bonding the lower structure 100' and the upper structure 200. In an implementation, the lower bonding pad 314 and the upper bonding pad 324 may provide an electrical connection path between the lower structure 100' and the upper structure 200. The lower bonding pad 314 and the upper bonding pad 324 may be bonded by copper (Cu)-to-copper (Cu) bonding.

FIGS. 10A to 13B are views of stages in a method of manufacturing a semiconductor device according to example embodiments. FIGS. 10A, 11A, 12A, and 13A each are plan views according to a process sequence of a region corresponding to FIG. 1, and FIGS. 10B, 11B, 12B, and 13B each are cross-sectional views according to a process sequence of a region corresponding to FIGS. 2A and 2B.

Figure 10A:
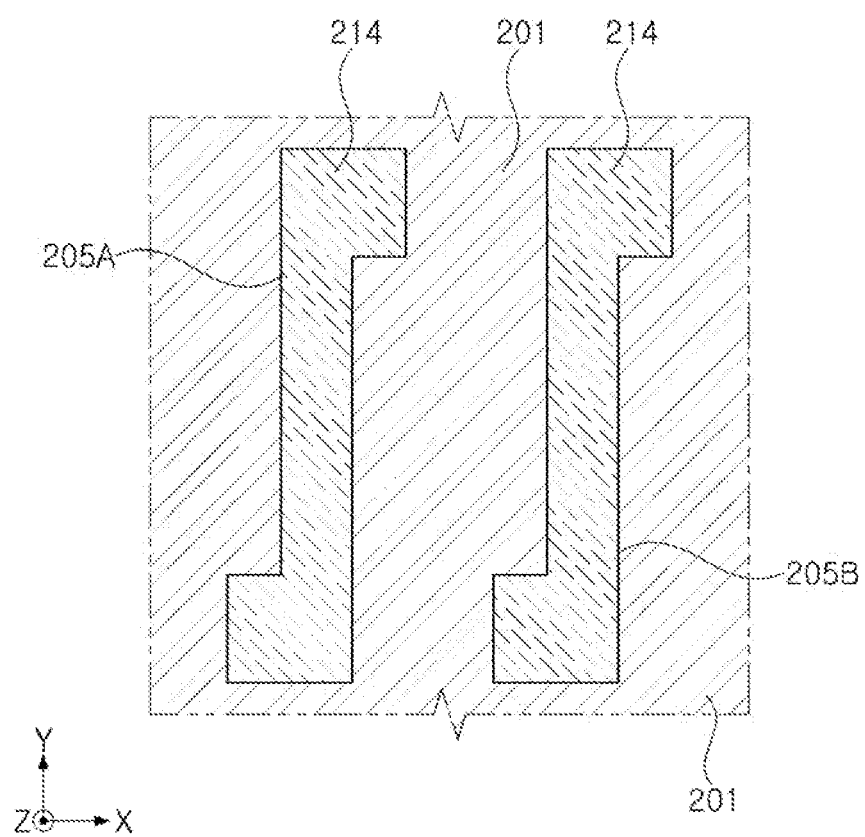
FIGS. 10A to 13B are views of stages in a method of manufacturing a semiconductor device according to example embodiments.
Figure 10B:
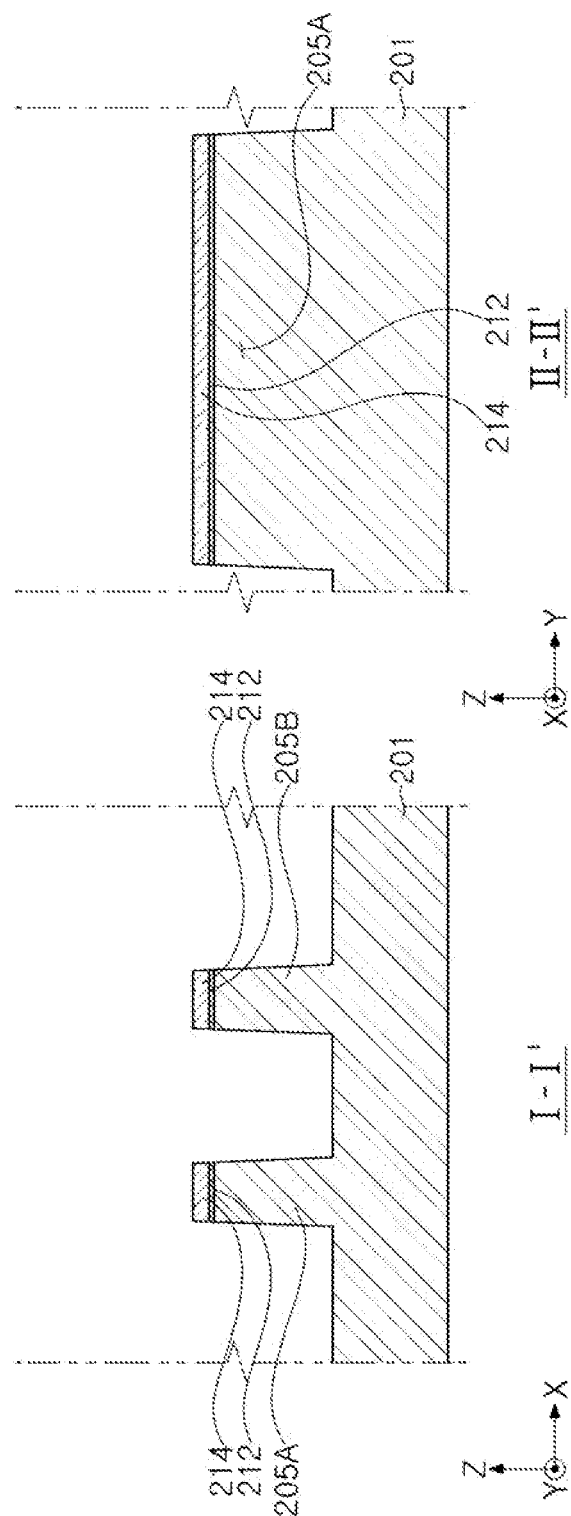

Referring to FIGS. 10A and 10B, the semiconductor substrate 201, the gate dielectric layer 212, and the lower gate pattern 214 may be patterned to define active regions 205A and 205B. Material layers forming the gate dielectric layer 212 and the lower gate pattern 214 may be deposited on the semiconductor substrate 201 and an etching process may be performed thereon using a mask layer to form trenches, thereby forming the active regions 205A and 205B. The trenches may have a shape with a width narrowing downwardly. In an implementation, the active regions 205A and 205B may be patterned to have a shape as shown in FIG. 10A, or may be patterned to have various suitable shapes.

Figure 11A:
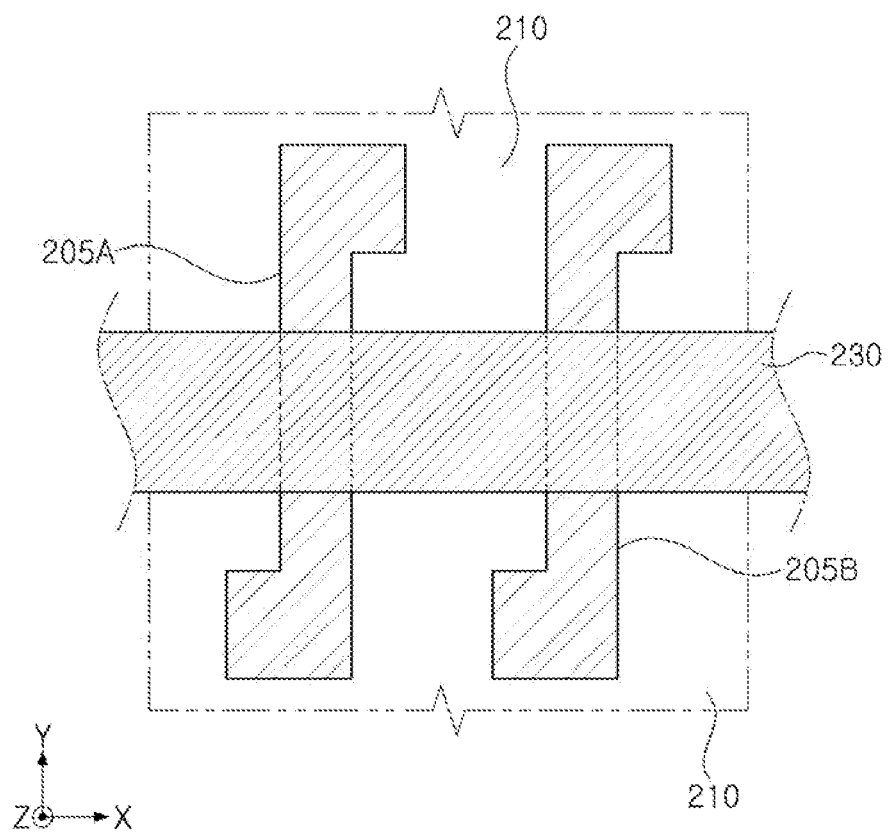
Figure 11B:
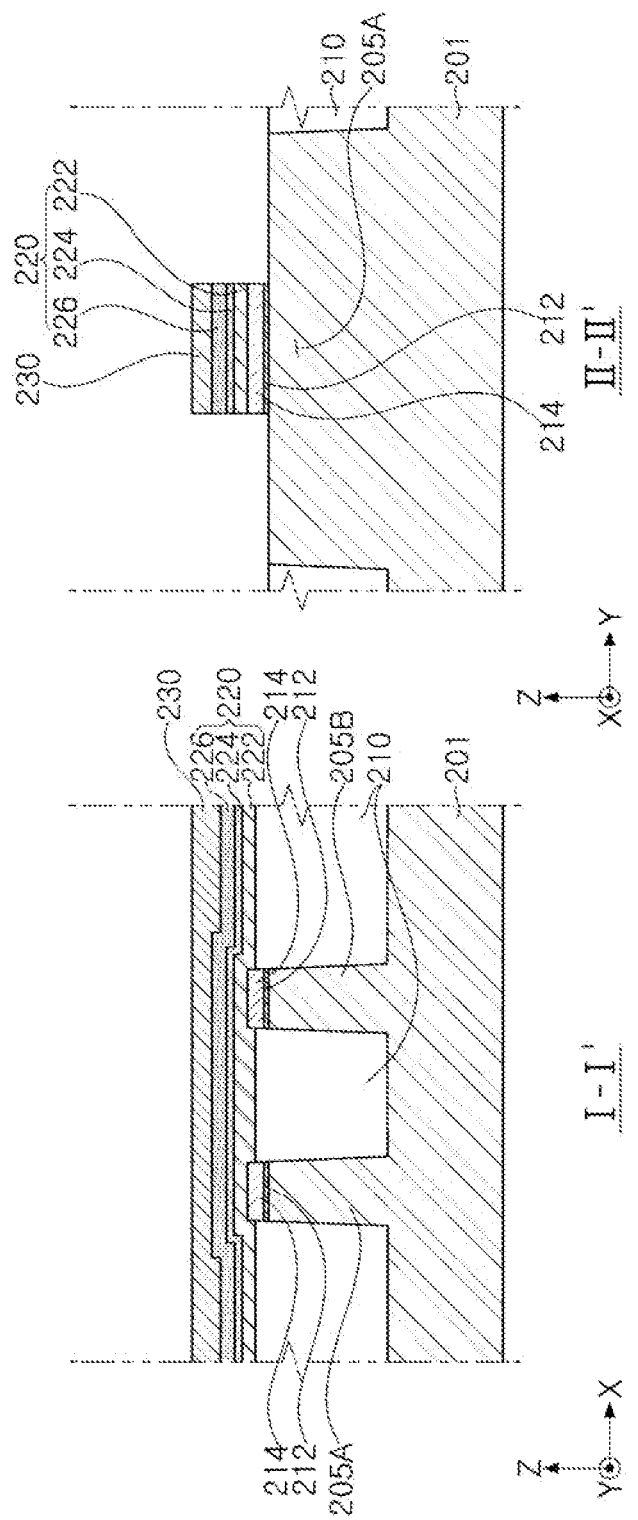

Referring to FIGS. 11A and 11B, an upper gate pattern 220 and a mask pattern layer 230 may be formed on the active regions 205A and 205B.

The upper gate pattern 220 and the mask pattern layer 230 may be formed to have a line shape that crosses the active regions 205A and 205B and extends in the X-direction. In an implementation, a spin on hardmask (SOH) mask layer and an antireflection layer including SiON may be formed on the mask pattern layer 230, and an etching process may then be performed. On both sides of the upper gate pattern 220 and the mask pattern layer 230, the gate dielectric layer 212 and the lower gate pattern 214 formed on the active regions 205A and 205B may be partially removed.

Figure 12A:
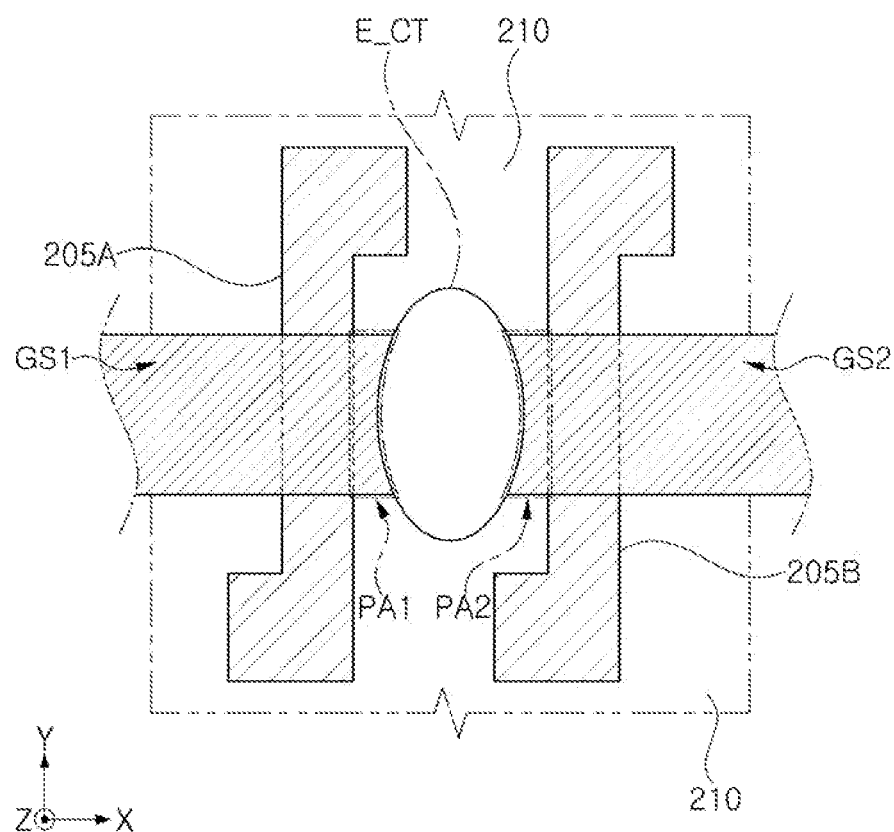
Figure 12B:
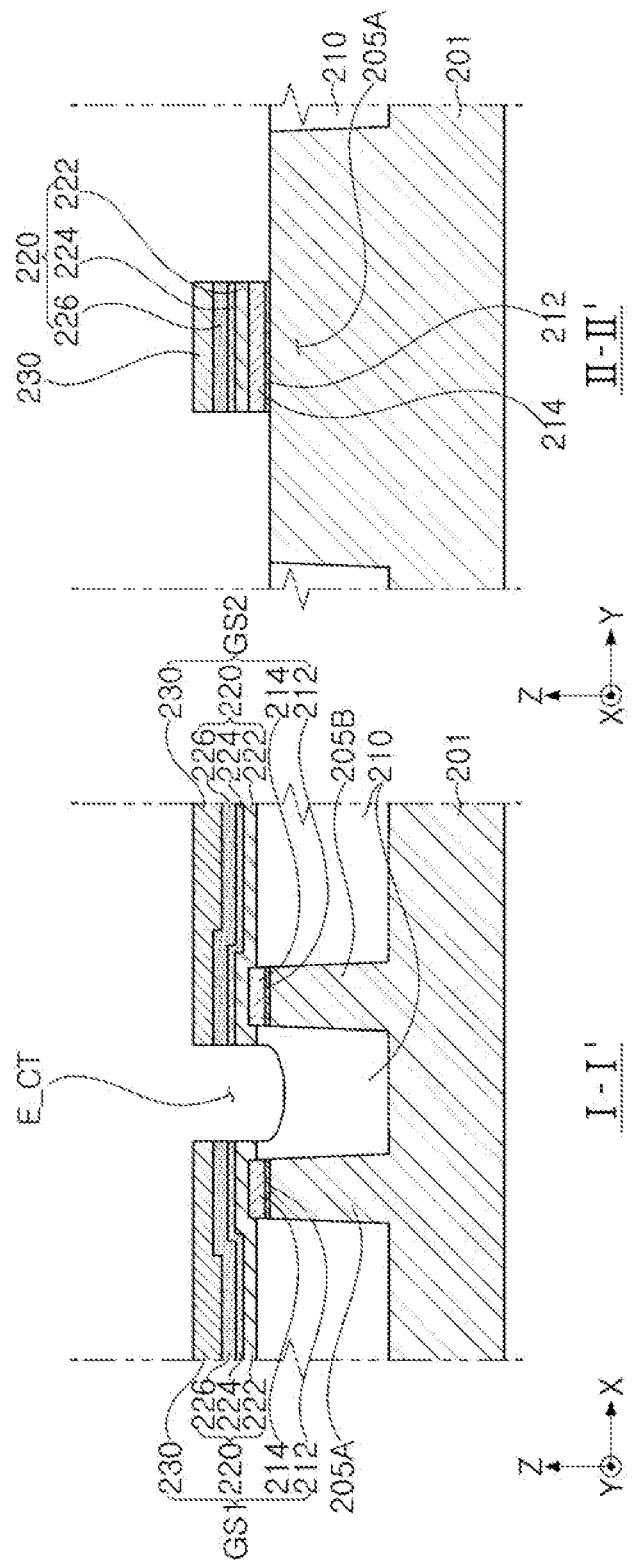

Referring to FIGS. 12A and 12B, a gate separation hole E_CT may be formed.

Between the active regions 205A and 205B, the gate dielectric layer 212, the lower gate pattern 214, the upper gate pattern 220, and the mask pattern layer 230 may be etched to form the gate separation hole E_CT. The first gate pattern structure GS1 and the second gate pattern structure GS2 (separated from each other in the X-direction) may be formed or defined by the gate separation hole E_CT. The gate separation hole E_CT may have a rounded hole shape instead of a line shape, and accordingly, the gate pattern structures GS1 and GS2 may be formed to have concavely (e.g., inwardly) rounded end portions PA1 and PA2. The gate separation hole E_CT may partially recess an upper surface of the isolation insulating layer 210.

Figure 13A:
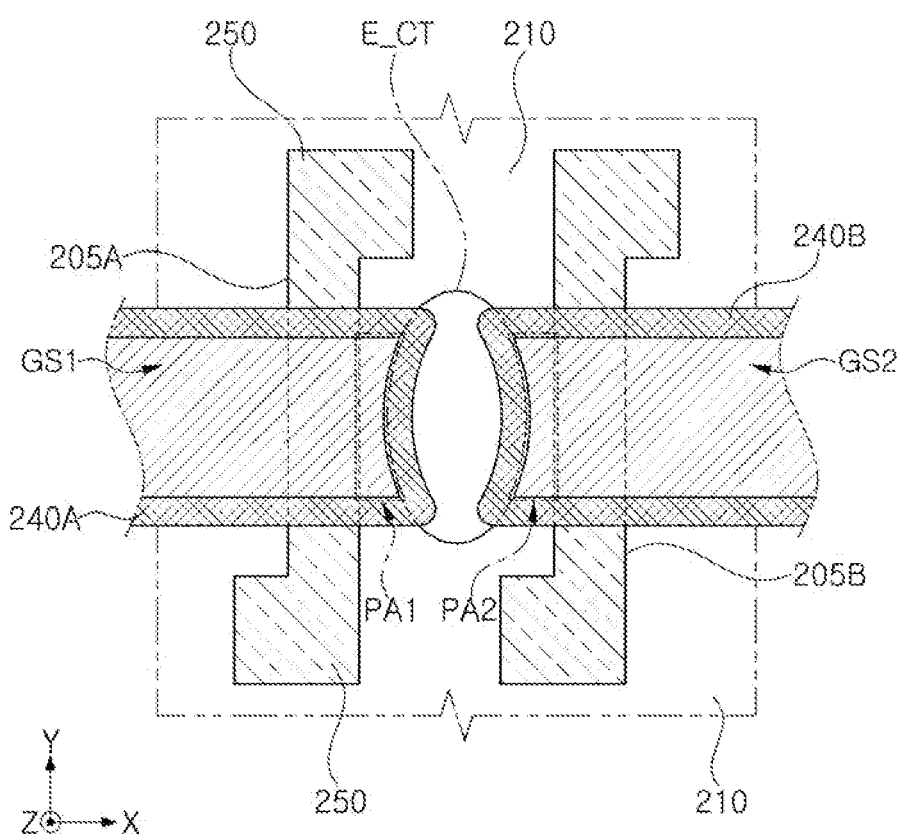
Figure 13B:
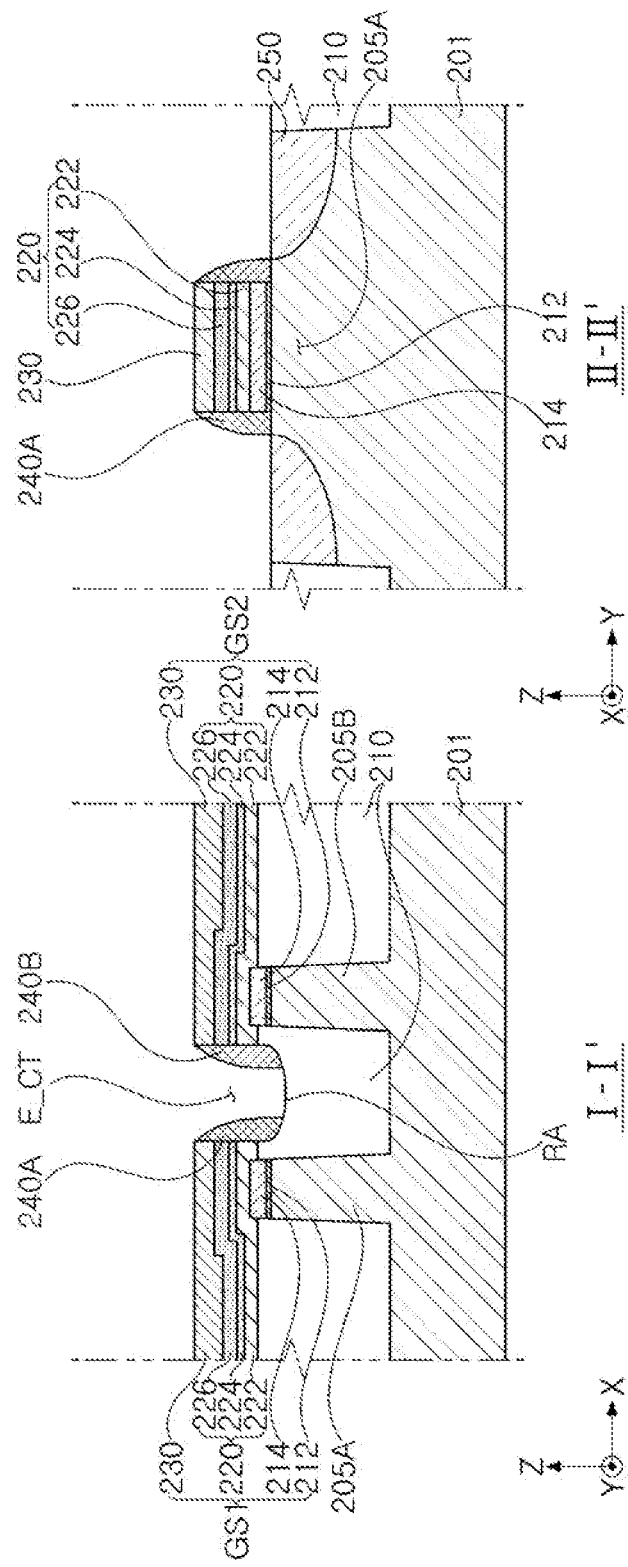

Referring to FIGS. 13A and 13B, spacer layers 240A and 240B may be formed, and source/drain regions 250 may be formed.

The spacer layers 240A and 240B may be formed on side surfaces of the gate pattern structures GS1 and GS2. The spacer layers 240A and 240B may be formed to cover the end portions PA1 and PA2 of the gate pattern structures GS1 and GS2.

On both sides of the gate pattern structures GS1 and GS2, source/drain regions 250 may be formed by implanting impurities into the active regions 205A and 205B.

Next, referring to FIGS. 1 to 2B, after the buffer insulating layer 260, the etch stop layer 270, and the insulating layer 280 are formed, the contact plugs 292 and 294 may be formed. Accordingly, the semiconductor device 100 of FIGS. 1 to 2B may be manufactured.

Meanwhile, after the lower interconnections 296 connected to the contact plugs 292 and 294 are formed to form the lower structure 100' including the lower interconnection structure 290, the upper structure 200 may be further formed to manufacture the semiconductor device 300. In an implementation, by alternately stacking gate electrodes 130 and interlayer insulating layers 120 on the upper substrate 101 and forming channel structures CH penetrating therethrough, the semiconductor device 300A shown in FIGS. 8A and 8B. may also be manufactured.

Figure 14:
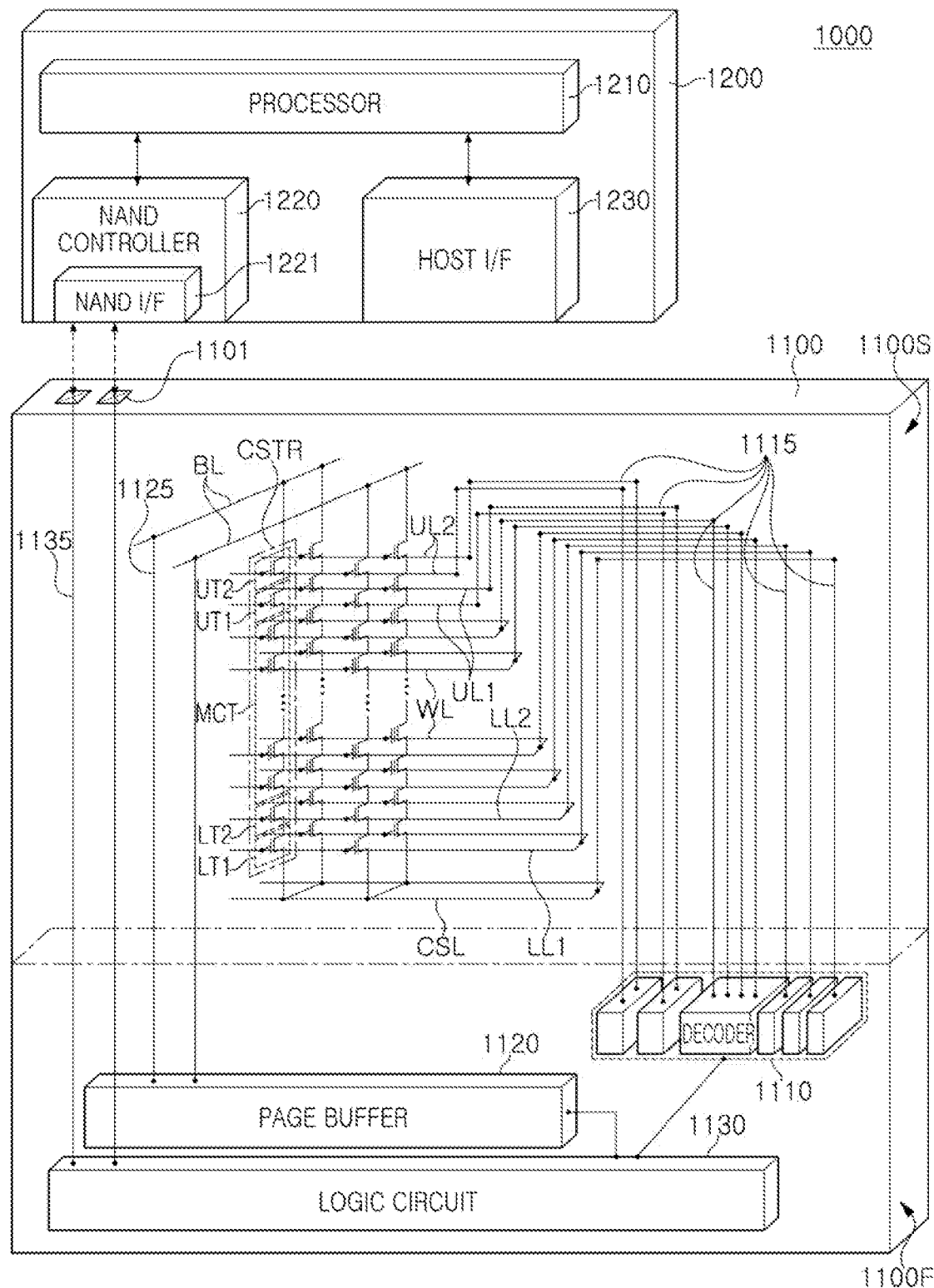
FIG. 14 is a view of a data storage system including a semiconductor device according to example embodiments.

FIG. 14 is a view schematically illustrating a data storage system including a semiconductor device according to example embodiments.

Referring to FIG. 14, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. In an implementation, the data storage system 1000 may be a solid state drive (SSD) device including one or a plurality of semiconductor devices 1100, a universal serial bus (USB), a computing system, a medical device, or a communication device.

The semiconductor device 1100 may be a non-volatile memory device and may be, e.g., the NAND flash memory device described above with reference to FIGS. 1 to 9. The semiconductor device 1100 may include a first structure 1100F and a second structure 1100S on the first structure 1100F. In an implementation, the first structure 1100F may be next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, and first and second gate lower lines LL1 and LL2, and memory cell strings CSTR between the bit line and the common source line CSL.

In the second structure 1100S, each of the memory cell strings CSTR may include lower transistors LT1 and LT2 adjacent to the common source line CSL, upper transistors UT1 and UT2 adjacent to the bit line BL, a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to embodiments.

In an implementation, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In an implementation, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using a gate induced drain leakage (GIDL) phenomenon.

The common source line CSL, the first and second gate lower lines LL1 and LL2, the word lines WL, and the first and second gate upper lines UL1 and UL2 may be electrically connected to a decoder circuit 1110 through first connection lines 1115 extending from within the first structure 1100F to the second structure 1100S. The bit lines BL may be electrically connected to the page buffer 1120 through second connection wires 1125 extending from within the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output (I/O) pad 1101 electrically connected to the logic circuit 1130. The I/O pad 1101 may be electrically connected to the logic circuit 1130 through an I/O connection line 1135 extending from within the first structure 1100F to the second structure 1100S.

The controller 1200 may include a processor 1210, a NAND controller 1220, and a host interface 1230. In an implementation, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written into the memory cell transistors MCT of the semiconductor device 1100, and data to be read from the memory cell transistors may be transmitted. The host interface 1230 may provide a communication function between the data storage system 1000 and an external host. When a control command is received from an external host through the host interface 1230, the processor 1210 may control the semiconductor device 1100 in response to the control command.

Figure 15:
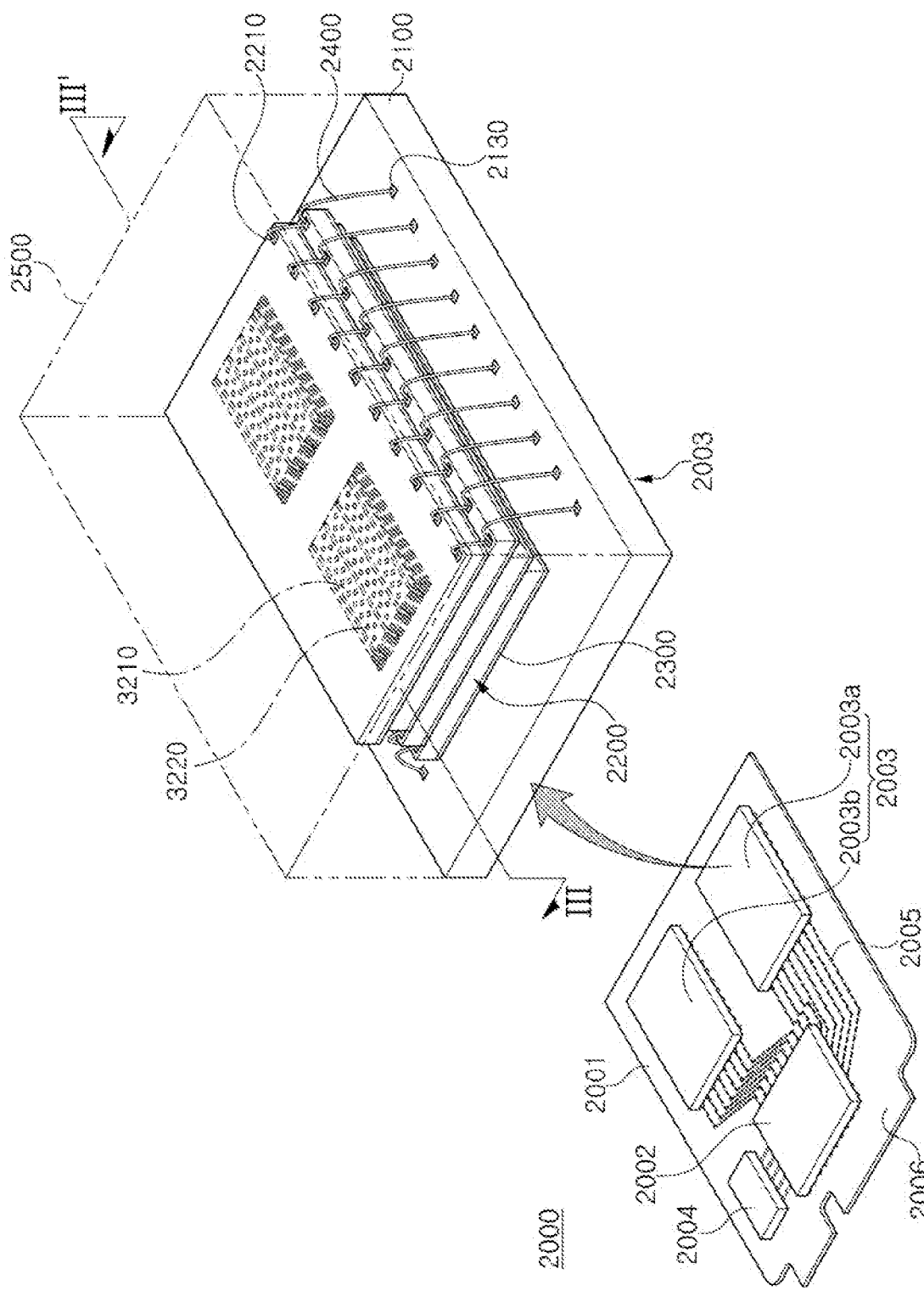
FIG. 15 is a perspective view of a data storage system including a semiconductor device according to an example embodiment.

FIG. 15 is a perspective view schematically illustrating a data storage system including a semiconductor device according to an example embodiment.

Referring to FIG. 15, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 on the main substrate 2001.

The main substrate 2001 may include a connector 2006 including a plurality of pins coupled to an external host. The number and arrangement of the plurality of pins in the connector 2006 may vary according to a communication interface between the data storage system 2000 and the external host. In an implementation, the data storage system 2000 may communicate with an external hot according to any one of interfaces such as M-Phy for a universal serial bus (USB), a peripheral component interconnect express (PCI-express), a serial advanced technology attachment (SATA), a universal flash storage (UFS), or the like. In an implementation, the data storage system 2000 may be operated by power supplied from the external host through the connector 2006. The data storage system 2000 may further include a power management integrated circuit (PMIC) for distributing power supplied from the external host to the controller 2002 and the semiconductor package 2003.

The controller 2002 may write data to the semiconductor package 2003 or read data therefrom and may improve an operating rate of the data storage system 2000.

The DRAM 2004 may be a buffer memory for alleviating a speed difference between the semiconductor package 2003, which is a data storage space, and the external host. The DRAM 2004 included in the data storage system 2000 may operate as a kind of cache memory and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 on lower surfaces of the semiconductor chips 2200, respectively, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an I/O pad 2210. The I/O pad 2210 may correspond to the I/O pad 1101 of FIG. 14. Each of the semiconductor chips 2200 may include gate stack structures 3210 and channel structures 3220. Each of the semiconductor chips 2200 may include the semiconductor device described above with reference to FIGS. 1 to 9.

In an implementation, the connection structure 2400 may be a bonding wire electrically connecting the I/O pad 2210 and the package upper pads 2130 to each other. Accordingly, in each of the first and second semiconductor packages 2003a and 2003b, the semiconductor chips 2200 may be electrically connected to each other by a bonding wire method and may be electrically connected to the package upper pads 2130 of the package substrate 2100. In an implementation, in each of the first and second semiconductor packages 2003a and 2003b, the semiconductor chips 2200 may be electrically connected to each other by a connection structure including a through-electrode (i.e., through-silicon via (TSV)), instead of the bonding wire-type connection structure 2400.

In an implementation, the controller 2002 and the semiconductor chips 2200 may be included in a single package. In an implementation, the controller 2002 and the semiconductor chips 2200 may be mounted on a separate interposer substrate different from the main substrate 2001 and may be connected to each other by an interconnection on the interposer substrate.

Figure 16:
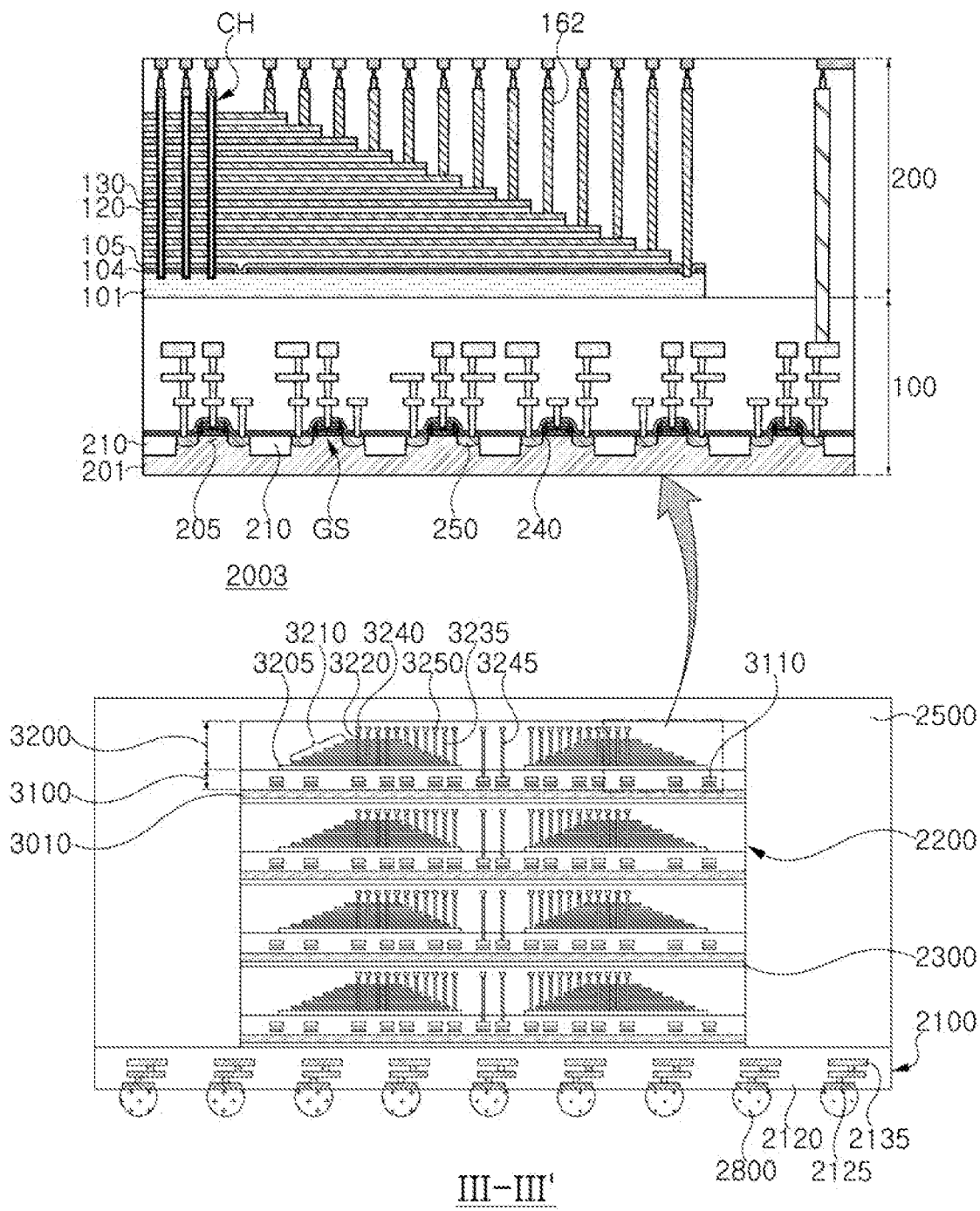
FIG. 16 is a cross-sectional view of a semiconductor package according to an example embodiment.

FIG. 16 is a cross-sectional view schematically illustrating a semiconductor package according to an example embodiment. FIG. 16 illustrates an example embodiment of the semiconductor package 2003 of FIG. 15 and conceptually illustrates a region of the semiconductor package 2003 of FIG. 15, taken along line IV-IV'.

Referring to FIG. 16, in the semiconductor package 2003, the package substrate 2100 may be a printed circuit board. The package substrate 2100 may include a package substrate body portion 2120, the package upper pads 2130 (refer to FIG. 15) on an upper surface of the package substrate body portion 2120, lower pads 2125 on a lower surface of the package substrate body portion 2120 or exposed through the lower surface thereof, and internal interconnections 2135 electrically connecting the package upper pads 2130 and the lower pads 2125 to each other in the package substrate body portion 2120. The package upper pads 2130 may be electrically connected to the connection structures 2400. The lower pads 2125 may be connected to the interconnection patterns 2005 of the main substrate 2010 of the data storage system 2000 as shown in FIG. 15 through conductive connectors 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and isolation regions 3230 penetrating through the gate stack structure 3210, bit lines 3240 electrically connected to the memory channel structures 3220, and gate contact plugs 3235 electrically connected to the word lines WL (refer to FIG. 14) of the gate stack structure 3210. As described above with reference to FIGS. 1 to 9, each of the semiconductor chips 2200 may include a semiconductor substrate 201, an active region 205, an isolation insulating layer 210, a gate pattern structure GS, a spacer layer 240, source/drain regions 250, an upper substrate 101, a gate electrodes 130, and channel structures CH.

Each of the semiconductor chips 2200 may include a through-interconnection 3245 electrically connected to the peripheral interconnections 3110 of the first structure 3100 and extending into the second structure 3200. The through-interconnection 3245 may be outside the gate stack structure 3210 and may penetrate through the gate stack structure 3210. Each of the semiconductor chips 2200 may further include the I/O pad 2210 (refer to FIG. 15) electrically connected to the peripheral interconnections 3110 of the first structure 3100.

By way of summation and review, a method for increasing data storage capacity of semiconductor devices may include a semiconductor device including memory cells arranged three-dimensionally, instead of memory cells arranged two-dimensionally.

As set forth above, by optimizing the patterning shape of the gate isolation region separating the gate pattern structures, device failure due to rounding of the end portions of the gate pattern structures may be minimized, and short circuits between the gate pattern structures may be prevented by securing the distance between the end portions.

One or more embodiments may provide a semiconductor device having improved electrical characteristics and reliability.

One or more embodiments may provide a data storage system including a semiconductor device having improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower structure; and
an upper structure on the lower structure and including a memory cell array, wherein:
the lower structure includes:
a semiconductor substrate,
a first active region and a second active region spaced apart from each other in a first direction on the semiconductor substrate, the first active region and second active region being defined by an isolation insulating layer on the semiconductor substrate, and
a first gate pattern structure and a second gate pattern structure extending in the first direction to cross the first active region and the second active region, respectively, on the semiconductor substrate,
wherein the first gate pattern structure includes:
a first gate dielectric layer on the first active region,
a first lower gate pattern on the first gate dielectric layer, and
a first upper gate pattern on the first lower gate pattern,
a side surface of the first gate dielectric layer and a side surface of the first lower gate pattern are substantially coplanar with a side surface of the first active region, and
the first upper gate pattern extends in the first direction beyond the side surface of the first lower gate pattern,
the first gate pattern structure and the second gate pattern structure have a first end portion and a second end portion spaced apart from each other in a facing manner in the first direction, respectively, and
the first end portion and the second end portion are concavely curved in opposite directions away from each other in a plan view.

2. The semiconductor device as claimed in claim 1, wherein:
the first gate pattern structure has a first side surface extending in the first direction,
the second gate pattern structure has a second side surface extending in the first direction, and
a minimum distance in the first direction between the first side surface of the first gate pattern structure and the second side surface of the second gate pattern structure is less than a distance in the first direction between a central portion of the first end portion of the first gate pattern structure and a central portion of the second end portion of the second gate pattern structure in the plan view.

3. The semiconductor device as claimed in claim 1, wherein a distance between the first active region and the second active region in the first direction is about 160 nm or less.

4. The semiconductor device as claimed in claim 1, wherein an upper surface of the isolation insulating layer between the first active region and the second active region includes a concave region recessed in a direction toward a lower surface of the isolation insulating layer.

5. The semiconductor device as claimed in claim 1, wherein:
the second gate pattern structure includes:
a second gate dielectric layer on the second active region,
a second lower gate pattern on the second gate dielectric layer, and
a second upper gate pattern on the second lower gate pattern,
a side surface of the second gate dielectric layer and a side surface of the second lower gate pattern are substantially coplanar with a side surface of the second active region, and
the second upper gate pattern extends in the first direction beyond the side surface of the second lower gate pattern.

6. The semiconductor device as claimed in claim 1, wherein:
the first upper gate pattern includes:
a first pattern layer,
a second pattern layer on the first pattern layer, and
a third pattern layer on the second pattern layer, and
the first pattern layer covers a portion of the side surface of the first lower gate pattern and extends along an upper surface of the isolation insulating layer.

7. The semiconductor device as claimed in claim 6, wherein:
the first lower gate pattern and the first pattern layer each include a doped silicon layer,
the second pattern layer includes a metal nitride layer, and
the third pattern layer includes a metal layer.

8. The semiconductor device as claimed in claim 5, wherein:
the first gate pattern structure has a first side surface extending in the first direction,
the second gate pattern structure has a second side surface extending in the first direction,
the first gate pattern structure further includes a first mask pattern layer on the first upper gate pattern,
the second gate pattern structure further includes a second mask pattern layer on the second upper gate pattern, and
the lower structure further includes:
a first spacer layer covering the first side surface and the first end portion of the first gate pattern structure,
a second spacer layer covering the second side surface and the second end portion of the second gate pattern structure and spaced apart from the first spacer layer,
first source/drain regions in a portion of the first active region on both sides of the first gate pattern structure,
second source/drain regions in a portion of the second active region on both sides of the second gate pattern structure,
a buffer insulating layer covering the first spacer layer, the second spacer layer, the first source/drain regions, the second source/drain regions, the first mask pattern layer, and the second mask pattern layer, and
an etch stop layer on the buffer insulating layer.

9. The semiconductor device as claimed in claim 8, wherein the etch stop layer extends between the first gate pattern structure and the second gate pattern structure and includes a vertex pointing toward an upper surface of the isolation insulating layer between the first active region and the second active region.

10. The semiconductor device as claimed in claim 1, wherein the upper structure includes:
an upper substrate on the lower structure,
a stack structure including interlayer insulating layers and gate electrodes alternately stacked in a vertical direction, perpendicular to an upper surface of the upper substrate, on the upper substrate, and
a channel structure penetrating through the stack structure in the vertical direction and including a channel layer.

11. A semiconductor device, comprising:
a lower structure; and
an upper structure on the lower structure, wherein:
the lower structure includes:
  a semiconductor substrate,
  a first active region and a second active region spaced apart from each other in a first direction on the semiconductor substrate, the first active region and second active region being defined by an isolation insulating layer on the semiconductor substrate, and
  a first gate pattern structure and a second gate pattern structure extending in the first direction to cross the first active region and the second active region, respectively, on the semiconductor substrate,
    wherein the first gate pattern structure includes:
      a first gate dielectric layer on the first active region,
      a first lower gate pattern on the first gate dielectric layer, and
      a first upper gate pattern on the first lower gate pattern,
    a side surface of the first gate dielectric layer and a side surface of the first lower gate pattern are substantially coplanar with a side surface of the first active region, and
    the first upper gate pattern extends in the first direction beyond the side surface of the first lower gate pattern,
  the first gate pattern structure has a first side surface extending in the first direction and a first end portion facing the second gate pattern structure,
  the second gate pattern structure has a second side surface extending in the first direction and a second end portion facing the first end portion of the first gate pattern structure, and
  a minimum distance in the first direction between the first side surface of the first gate pattern structure and the second side surface of the second gate pattern structure is less than a distance in the first direction between a central portion of the first end portion of the first gate pattern structure and a central portion of the second end portion of the second gate pattern structure in a plan view.

12. The semiconductor device as claimed in claim 11, wherein the first side surface of the first gate pattern structure and a cross-section of the first end portion meet at an acute angle in the plan view.

13. The semiconductor device as claimed in claim 11, wherein the lower structure includes:
a first spacer layer covering the first side surface and the first end portion of the first gate pattern structure, and
a second spacer layer covering the second side surface and the second end portion of the second gate pattern structure and spaced apart from the first spacer layer.

14. The semiconductor device as claimed in claim 13, wherein:
an upper surface of the isolation insulating layer between the first active region and the second active region includes a concave region recessed in a direction toward a lower surface of the isolation insulating layer, and
the first spacer layer and the second spacer layer at least partially cover the concave region of the upper surface of the isolation insulating layer.

15. The semiconductor device as claimed in claim 11, wherein at least one of the first active region and the second active region includes an extension portion extending in a second direction, perpendicular to the first direction, and a contact portion on both sides of the extension portion in the second direction and connected to the extension portion, and the contact portion is bent from the extension portion.

16. The semiconductor device as claimed in claim 15, wherein:
the contact portion includes a first contact portion and a second contact portion on both sides of the extension portion in the second direction, and
the first contact portion and the second contact portion are bent from the extension portion in opposite directions.

17. The semiconductor device as claimed in claim 11, wherein at least one of the first active region and the second active region extends in a direction slanted to the first direction.

18. A data storage system, comprising:
a semiconductor storage device including a lower structure including a semiconductor substrate, circuit elements on the semiconductor substrate, and a lower interconnection structure electrically connected to the circuit elements, an upper structure on the lower structure, and an input/output (I/O) pad electrically connected to the circuit elements; and
a controller electrically connected to the semiconductor storage device through the I/O pad and controlling the semiconductor storage device,
wherein:
the circuit elements of the lower structure include:
  a first active region and a second active region spaced apart from each other in a first direction on the semiconductor substrate, the first active region and second active region being defined by an isolation insulating layer on the semiconductor substrate, and
  a first gate pattern structure and a second gate pattern structure respectively crossing the first active region and the second active region to extend in the first direction on the semiconductor substrate,
    wherein the first gate pattern structure includes:
      a first gate dielectric layer on the first active region,
      a first lower gate pattern on the first gate dielectric layer, and
      a first upper gate pattern on the first lower gate pattern,
    a side surface of the first gate dielectric layer and a side surface of the first lower gate pattern are substantially coplanar with a side surface of the first active region, and
    the first upper gate pattern extends in the first direction beyond the side surface of the first lower gate pattern,
the upper structure includes:
  an upper substrate on the lower structure,
  a stack structure including interlayer insulating layers and gate electrodes alternately stacked in a vertical direction, perpendicular to an upper surface of the upper substrate, on the upper substrate, and
  a channel structure penetrating through the stack structure in the vertical direction and including a channel layer,
the first gate pattern structure and the second gate pattern structure include a first end portion and a second end portion spaced apart from each other in a facing manner in the first direction, respectively, and
the first end portion and the second end portion are concavely curved in opposite directions away from each other in a plan view.

19. The data storage system as claimed in claim 18, wherein:
- the first gate pattern structure has a first side surface extending in the first direction,
- the second gate pattern structure has a second side surface extending in the first direction, and
- a minimum distance in the first direction between the first side surface of the first gate pattern structure and the second side surface of the second gate pattern structure is less than a distance in the first direction between a central portion of the first end portion of the first gate pattern structure and a central portion of the second end portion of the second gate pattern structure in the plan view.

* * * * *